(12) United States Patent
Blandino et al.

(10) Patent No.: US 7,538,473 B2
(45) Date of Patent: May 26, 2009

(54) DRIVE CIRCUITS AND METHODS FOR ULTRASONIC PIEZOELECTRIC ACTUATORS

(75) Inventors: Thomas P. Blandino, Cottage Grove, WI (US); Tai P. Luc, Oak Creek, WI (US); Peter Zhou, Tian Jin (CN)

(73) Assignee: S.C. Johnson & Son, Inc., Racine, WI (US)

( * ) Notice: Subject to any disclaimer, the term of this patent is extended or adjusted under 35 U.S.C. 154(b) by 254 days.

(21) Appl. No.: 11/464,419

(22) Filed: Aug. 14, 2006

(65) Prior Publication Data
US 2007/0046143 A1 Mar. 1, 2007

Related U.S. Application Data

(63) Continuation-in-part of application No. 11/264,952, filed on Nov. 2, 2005, which is a continuation-in-part of application No. 11/140,329, filed on May 27, 2005, now Pat. No. 7,350,720, which is a continuation-in-part of application No. 11/050,242, filed on Feb. 3, 2005, now Pat. No. 7,503,668, application No. 11/464,419, which is a continuation-in-part of application No. 11/401,572, filed on Apr. 11, 2006, and a continuation-in-part of application No. 11/247,793, filed on Oct. 11, 2005, and a continuation-in-part of application No. 11/050,169, filed on Feb. 3, 2005.

(60) Provisional application No. 60/541,067, filed on Feb. 3, 2004, provisional application No. 60/617,950, filed on Oct. 12, 2004.

(51) Int. Cl.
H01L 41/09 (2006.01)
(52) U.S. Cl. .................. 310/317; 310/316.03
(58) Field of Classification Search ............ 310/316.03, 310/317, 319
See application file for complete search history.

(56) References Cited

U.S. PATENT DOCUMENTS

| 3,589,563 | A | 6/1971 | Carragan et al. |
| 4,113,809 | A | 9/1978 | Abair et al. |
| 4,228,440 | A | 10/1980 | Horike et al. |

(Continued)

FOREIGN PATENT DOCUMENTS

DE 297 13 945 10/1997

(Continued)

OTHER PUBLICATIONS

Office Action in U.S. Appl. No. 11/140,329 dated Apr. 27, 2007.

(Continued)

*Primary Examiner*—Quyen Leung
*Assistant Examiner*—Derek J Rosenau

(57) ABSTRACT

A drive circuit for and method of driving a piezoelectric actuator utilizes an impedance coupled to the piezoelectric actuator, wherein the impedance and the piezoelectric actuator together form a tank circuit that has a resonant frequency. A first circuit is provided that drives the actuator at the resonant frequency and a second circuit is further provided that selectively operates the first circuit in one of at least two modes of operation including a first mode that causes the actuator to be energized at a first duty cycle and a second mode that causes the actuator to be energized at a second duty cycle.

45 Claims, 15 Drawing Sheets

U.S. PATENT DOCUMENTS

| | | | |
|---|---|---|---|
| 4,632,311 A | 12/1986 | Nakane et al. | |
| 4,833,358 A | 5/1989 | Suzuki et al. | |
| 4,849,872 A | 7/1989 | Gässler | |
| 4,866,580 A | 9/1989 | Blackerby | |
| 4,877,989 A | 10/1989 | Drews et al. | |
| 5,006,724 A | 4/1991 | Liu | |
| 5,087,850 A | 2/1992 | Suzuta | |
| 5,097,180 A | 3/1992 | Ignon et al. | |
| 5,128,595 A | 7/1992 | Hara | |
| 5,297,734 A | 3/1994 | Toda | |
| 5,311,093 A | 5/1994 | Mukohjima | |
| 5,452,711 A | 9/1995 | Gault | |
| 5,462,839 A | 10/1995 | de Rooij et al. | |
| 5,551,416 A | 9/1996 | Stimpson et al. | |
| 5,673,825 A | 10/1997 | Chen | |
| 5,777,445 A | 7/1998 | Motegi | |
| 5,828,295 A | 10/1998 | Mittel et al. | |
| 5,842,763 A | 12/1998 | Lakosky | |
| 5,955,819 A | 9/1999 | Takano et al. | |
| 5,970,974 A | 10/1999 | Van Der Linden et al. | |
| 6,066,924 A | 5/2000 | Lederer | |
| 6,100,654 A | 8/2000 | Izukawa et al. | |
| 6,196,219 B1 | 3/2001 | Hess et al. | |
| 6,198,198 B1 | 3/2001 | Fujimura et al. | |
| RE37,168 E | 5/2001 | St. Louis | |
| 6,234,017 B1 | 5/2001 | Stevens et al. | |
| 6,296,196 B1 | 10/2001 | Denen et al. | |
| 6,362,578 B1 | 3/2002 | Swanson et al. | |
| 6,400,096 B1 | 6/2002 | Wells et al. | |
| 6,405,934 B1 | 6/2002 | Hess et al. | |
| 6,483,226 B1 | 11/2002 | Okada | |
| 6,508,411 B1 | 1/2003 | Ohnishi et al. | |
| 6,554,203 B2 | 4/2003 | Hess et al. | |
| 6,586,890 B2 | 7/2003 | Min et al. | |
| 6,608,426 B2 | 8/2003 | Hayashi et al. | |
| 6,616,308 B2 | 9/2003 | Jensen et al. | |
| 6,639,367 B2 | 10/2003 | Wells et al. | |
| 6,644,507 B2 | 11/2003 | Borut et al. | |
| 6,680,620 B2 | 1/2004 | Hedenetz et al. | |
| 6,719,443 B2 | 4/2004 | Gutstein et al. | |
| 6,720,705 B2 | 4/2004 | Nakatsuka et al. | |
| 6,722,582 B2 | 4/2004 | Hess et al. | |
| 6,747,391 B1 | 6/2004 | Ben-Yaakov | |
| 6,802,460 B2 | 10/2004 | Hess et al. | |
| 6,803,699 B2 | 10/2004 | Yuasa et al. | |
| 6,805,303 B2 | 10/2004 | Hess et al. | |
| 6,815,871 B2 | 11/2004 | Yuasa et al. | |
| 6,819,027 B2 | 11/2004 | Saraf | |
| 6,828,712 B2 | 12/2004 | Battaglin et al. | |
| 6,836,081 B2 | 12/2004 | Swanson et al. | |
| 6,843,430 B2 | 1/2005 | Boticki et al. | |
| 6,844,658 B2 | 1/2005 | Hoshino | |
| 6,891,311 B2 | 5/2005 | Phelps et al. | |
| 6,926,423 B2 | 8/2005 | Bucher et al. | |
| 7,049,752 B2 | 5/2006 | Tani et al. | |
| 7,061,157 B2 | 6/2006 | Battaglin et al. | |
| 7,332,878 B1 | 2/2008 | Smith | |
| 2003/0016824 A1 | 1/2003 | Epstein | |
| 2003/0102384 A1* | 6/2003 | Walter et al. | 239/102.2 |
| 2003/0192959 A1 | 10/2003 | Hess et al. | |
| 2004/0124173 A1 | 7/2004 | Hess et al. | |
| 2004/0200907 A1 | 10/2004 | Martens, III et al. | |
| 2004/0251778 A1 | 12/2004 | Hoshino | |
| 2004/0263567 A1 | 12/2004 | Hess et al. | |
| 2005/0067921 A1 | 3/2005 | Yamamoto | |
| 2005/0166945 A1 | 8/2005 | Whitmore | |
| 2005/0169666 A1 | 8/2005 | Porchia et al. | |
| 2005/0169812 A1 | 8/2005 | Helf et al. | |
| 2005/0185392 A1 | 8/2005 | Walter et al. | |
| 2005/0196716 A1 | 9/2005 | Haab et al. | |
| 2005/0205916 A1 | 9/2005 | Conway et al. | |
| 2005/0219302 A1 | 10/2005 | Vogeley | |
| 2005/0225201 A1 | 10/2005 | Vogeley | |
| 2005/0225202 A1 | 10/2005 | Vogeley et al. | |
| 2005/0230495 A1 | 10/2005 | Feriani et al. | |
| 2005/0242685 A1 | 11/2005 | Yuasa | |
| 2005/0280334 A1 | 12/2005 | Ott et al. | |
| 2006/0001332 A1 | 1/2006 | Ollila | |
| 2006/0049716 A1 | 3/2006 | Yuasa | |
| 2006/0055284 A1 | 3/2006 | Hoshino | |
| 2006/0056999 A1 | 3/2006 | East | |
| 2006/0061232 A1 | 3/2006 | Min et al. | |
| 2006/0071614 A1 | 4/2006 | Tripathi et al. | |
| 2006/0091826 A1 | 5/2006 | Chen | |
| 2006/0115386 A1 | 6/2006 | Michaels et al. | |
| 2006/0120080 A1 | 6/2006 | Sipinski et al. | |
| 2006/0125420 A1 | 6/2006 | Boone et al. | |
| 2006/0175426 A1 | 8/2006 | Schramm et al. | |
| 2006/0192728 A1 | 8/2006 | Kim | |
| 2006/0197469 A1 | 9/2006 | Kim | |
| 2006/0208666 A1 | 9/2006 | Johnson | |
| 2007/0154857 A1 | 7/2007 | Cho | |
| 2007/0177393 A1 | 8/2007 | Hirata | |
| 2008/0074875 A1 | 3/2008 | Jensen et al. | |
| 2008/0191638 A1* | 8/2008 | Kuennen et al. | 315/279 |

FOREIGN PATENT DOCUMENTS

| | | |
|---|---|---|
| DE | 201 03 621 | 5/2001 |
| EP | 480 615 | 4/1992 |
| EP | 824 022 | 2/1998 |
| EP | 824 023 | 2/1998 |
| EP | 923 957 | 6/1999 |
| EP | 937 478 | 8/1999 |
| EP | 1 005 917 | 6/2000 |
| EP | 1 103 653 | 5/2001 |
| EP | 1 184 083 | 3/2002 |
| EP | 1 287 904 | 3/2003 |
| EP | 1 287 905 | 3/2003 |
| GB | 2 398 627 | 8/2004 |
| JP | 38-10166 | 5/1938 |
| JP | 43-14553 | 6/1943 |
| JP | 54-167416 | 11/1979 |
| JP | 60-29149 | 2/1985 |
| JP | 61-138557 | 6/1986 |
| JP | 62-27644 | 2/1987 |
| JP | 62-32962 | 2/1987 |
| JP | 62-119941 | 7/1987 |
| JP | 63-3839 | 1/1988 |
| JP | 63-36282 | 3/1988 |
| JP | 63-155379 | 10/1988 |
| JP | 63-182754 | 11/1988 |
| JP | 1-149966 | 10/1989 |
| JP | 2-187165 | 7/1990 |
| JP | 2-114048 | 9/1990 |
| JP | 2-220665 | 9/1990 |
| JP | 3-47262 | 2/1991 |
| JP | 3-63058 | 3/1991 |
| JP | 3-73156 | 3/1991 |
| JP | 3-60956 | 6/1991 |
| JP | 3-159652 | 7/1991 |
| JP | 3-234262 | 10/1991 |
| JP | 4-30859 | 2/1992 |
| JP | 4-27940 | 3/1992 |
| JP | 4-150968 | 5/1992 |
| JP | 4-156855 | 5/1992 |
| JP | 4-207798 | 7/1992 |
| JP | 4-207799 | 7/1992 |
| JP | 4-207800 | 7/1992 |
| JP | 4-338468 | 11/1992 |
| JP | 4-371257 | 12/1992 |
| JP | 5-156 | 1/1993 |
| JP | 5-24044 | 3/1993 |
| JP | 5-184993 | 7/1993 |

| | | |
|---|---|---|
| JP | 5-212331 | 8/1993 |
| JP | 5-261324 | 10/1993 |
| JP | 5-305257 | 11/1993 |
| JP | 6-320083 | 11/1994 |
| JP | 6-320084 | 11/1994 |
| JP | 6-335646 | 12/1994 |
| JP | 6-335647 | 12/1994 |
| JP | 7-8865 | 1/1995 |
| JP | 7-24375 | 1/1995 |
| JP | 7-116574 | 5/1995 |
| JP | 8-52216 | 2/1996 |
| JP | 8-071570 | 3/1996 |
| JP | 2511119 | 6/1996 |
| JP | 8-215308 | 8/1996 |
| JP | 8-281165 | 10/1996 |
| JP | 2544634 | 5/1997 |
| JP | 09-201155 | 8/1997 |
| JP | 9-244575 | 9/1997 |
| JP | 11-221505 | 8/1999 |
| JP | 2001-070851 | 3/2001 |
| JP | 2002-086035 | 3/2002 |
| JP | 2003-181347 | 7/2003 |
| WO | WO 00/47335 | 8/2000 |
| WO | WO 02/068128 | 9/2002 |
| WO | WO 03/068412 | 8/2003 |
| WO | WO 03/068413 | 8/2003 |
| WO | WO 03/098971 | * 11/2003 |
| WO | WO 05/097348 | 10/2005 |
| WO | WO 05/098982 | 10/2005 |
| WO | WO 2007/045831 | 4/2007 |
| WO | WO 2007/045832 | 4/2007 |
| WO | WO 2007/045834 | 4/2007 |
| WO | WO 2007/045835 | 4/2007 |
| WO | WO 2008/016867 | 2/2008 |

OTHER PUBLICATIONS

Office Action in U.S. Appl. No. 11/050,242 dated Jul. 19, 2007.
International Search Report and Written Opinion in PCT/US2006/042919 dated Apr. 20, 2007.
International Search Report in PCT/US2006/042971 dated Mar. 22, 2007.
Written Opinion in PCT/US2006/042971 dated Mar. 22, 2007.
International Search Report and Written Opinion in PCT/US2007/025160 dated Apr. 11, 2008.
Office Action in U.S. Appl. No. 11/050,169, filed Oct. 15, 2008.
Office Action in U.S. Appl. No. 11/264,952, filed Oct. 24, 2008.

* cited by examiner

DRIVE CIRCUITS AND METHODS FOR ULTRASONIC PIEZOELECTRIC ACTUATORS

CROSS REFERENCE TO RELATED APPLICATIONS

This application is a continuation-in-part of U.S. application Ser. No. 11/264,952, filed Nov. 2, 2005, entitled "Control and Integrated Circuit for a Multisensory Apparatus," which is a continuation-in-part of U.S. application Ser. No. 11/140,329, filed May 27, 2005 now U.S. Pat. No. 7,350,720, entitled "Active Material Emitting Device," which is a continuation-in-part of U.S. application Ser. No. 11/050,242, filed Feb. 3, 2005, entitled "Device Providing Coordinated Emission of Light and Volatile Active," which claims the benefit of U.S. Provisional Application No. 60/541,067, filed Feb. 3, 2004, and is further a continuation-in-part of U.S. application Ser. No. 11/050,169, filed Feb. 3, 2005, entitled "Device Providing Coordinated Emission of Light and Volatile Active," which claims the benefit of U.S. Provisional Application No. 60/541,067, filed Feb. 3, 2004, and is further a continuation-in-part of U.S. application Ser. No. 11/247,793, filed Oct. 11, 2005, entitled "Compact Spray Device," which claims the benefit of U.S. Provisional Application No, 60/617,950, filed Oct. 12, 2004, and is further a continuation-in-part of U.S. application Ser. No. 11/401,572, filed Apr. 11, 2006, entitled "Electronic Aerosol Device."

REFERENCE REGARDING FEDERALLY SPONSORED RESEARCH OR DEVELOPMENT

Not applicable

SEQUENTIAL LISTING

Not applicable

BACKGROUND OF THE INVENTION

1. Field of the Invention

The present disclosure relates generally for drive circuits for electrostrictive transducers, and more particularly, to drive circuits for piezoelectric actuators.

2. Description of the Background of the Invention

Drive circuits have been developed that are useful with piezoelectric actuators to cause the piezoelectric actuator to undertake useful work. Various methodologies have been utilized to cause the actuator to oscillate at a particular single frequency or range of frequencies. In addition, piezoelectric actuators can be designed to oscillate in a single or multiple bending modes.

A product sold by the assignee of the present application under the WISP® trademark dispenses a volatile liquid for air freshening purposes. The WISP® brand fragrance dispenser includes a piezoelectric actuator coupled to a curved plate having a plurality of small orifices extending therethrough. A volatile fragrance in fluid form is supplied in a refill container having a wick that transports the fragrance to the curved plate when the refill container is placed in the fragrance dispenser in an operative position. Electrical circuitry is provided to periodically operate the piezoelectric actuator and thereby cause emissions of fragrance droplets at a selectable emission frequency. Specifically, the electrical circuitry is responsive to the position of a switch to develop a series of emission sequences wherein consecutive emission sequences are separated from one another in time by a period that is dependent upon the switch position. The electrical circuitry includes an application specific integrated circuit (ASIC) that develops a drive voltage for the piezoelectric actuator wherein the drive voltage is ramped up and down in frequency during each emission sequence between preselected frequency limits. This approach is utilized to take into account that fact that it is desirable to drive the piezoelectric actuator at one of the resonant frequencies thereof for at least a portion of the emission sequence so that adequate atomization is achieved and due to the fact that the resonant frequencies vary from actuator to actuator. The need to sweep the drive voltage across a band of frequencies results in increased electrical requirements.

SUMMARY OF THE INVENTION

According, to one aspect of the present invention, a drive circuit for a piezoelectric actuator includes an impedance coupled to the piezoelectric actuator wherein the impedance and the piezoelectric actuator together form a tank circuit that has a resonant frequency. A first circuit drives the actuator at the resonant frequency. The first circuit includes a current detector coupled to the tank circuit and that develops a current signal representing current flow in the circuit. A feedback capacitor is coupled to the resistance for phase shifting the current signal and a second circuit is responsive to the phase shifted current signal and a gating signal. The second circuit selectively operates the first circuit in one of at least two modes of operation including a first mode that causes the actuator to be energized at a first duty cycle and a second mode that causes the actuator to be energized at a second duty cycle greater than the first duty cycle.

According to another aspect of the present invention, a drive circuit for a piezoelectric actuator that dispenses a volatile comprises an impedance coupled to the piezoelectric actuator wherein the impedance and the piezoelectric actuator together form a tank circuit that has a resonant frequency. A first circuit drives the actuator at the resonant frequency, the first circuit including a current detector coupled to the tank circuit and that develops a current signal representing current flow in the tank circuit. A feedback capacitor is coupled to the resistance for phase shifting the current signal and a second circuit is responsive to the phase shifted current signal and a gating signal that selectively operates the first circuit in one of at least two modes of operation. A first mode of operation causes the actuator to dispense volatile at a first rate and a second mode of operation causes the actuator to dispense volatile at a second rate greater than the first rate, wherein the first mode comprises automatically periodically energizing the actuator upon startup of the drive circuit, and wherein the second mode temporarily overrides the first mode when the second mode is selected,.

According to yet another aspect of the present invention, a method of driving a piezoelectric actuator includes the step of coupling an impedance to the piezoelectric actuator, wherein the impedance and the piezoelectric actuator together form a tank circuit that has a resonant frequency. The method further includes the step of providing a first circuit that drives the actuator at the resonant frequency wherein the first circuit includes a current detector coupled to the tank circuit and that develops a current signal representing current flow in the tank circuits A feedback capacitor is coupled to the resistance for phase shifting the current signal and a second circuit is provided that is responsive to the phase shifted current signal and a gating signal and that selectively operates the first circuit in one of at least two modes of operation. A first mode of operation causes the actuator to be energized at a first duty cycle and a second mode of operation causes the actuator to be energized at a second duty cycle greater than the first duty cycle.

Other aspects and advantages of the present invention will become apparent upon consideration of the following drawings and detailed description.

BRIEF DESCRIPTION OF THE DRAWINGS

Throughout the figures, like or corresponding reference numerals have been used for like or corresponding parts.

DETAILED DESCRIPTION OF THE PREFERRED EMBODIMENTS

Figure 1:
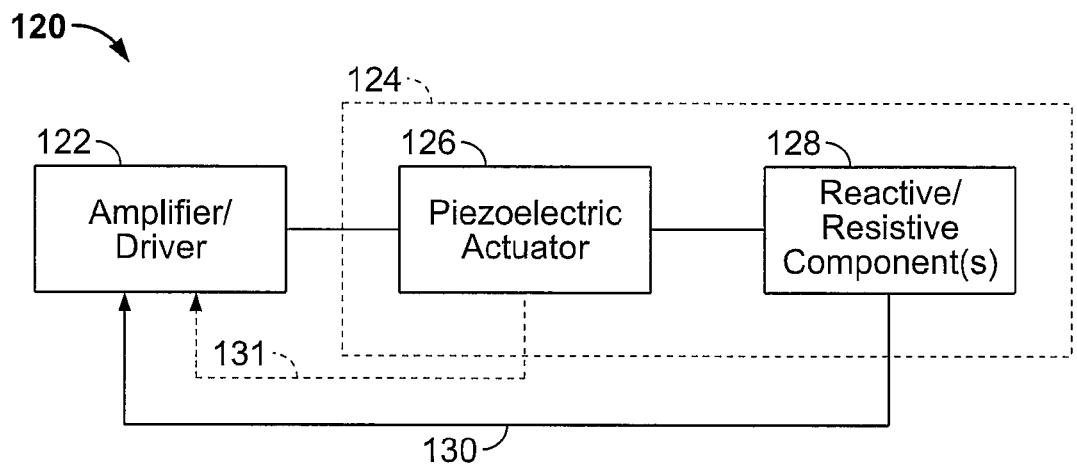
FIG. 1 is a generalized block diagram of a drive circuit for a piezoelectric actuator.

Disclosed herein are circuits for driving piezoelectric actuators in which one or more impedances, such as an inductor, is coupled to the actuator. The purpose of the inductor is to act in conjunction with the parasitic parallel capacitance of the actuator as an impedance transformation network. Specifically, the piezoelectric actuator requires high voltage and low current, while the driver circuit coupled to the actuator provides low voltage and high current thereto. The combination of the inductor and parasitic capacitance efficiently transforms the low impedance output of the driver circuit to the high impedance of the actuator.

The combination of reactances of the impedance transformation network and the piezoelectric transducer, the totality of which comprises a tank circuit, determines the frequency at which the circuit operates.

One difference between the actuation circuitry used in the WISP® brand fragrance dispenser and the embodiments disclosed herein is this method of impedance transformation.

The actuation circuitry of the WISP® brand fragrance dispenser uses a transformer for impedance transformation, but does not utilize the parasitic parallel capacitance of the transducer.

Another major difference is that the embodiments disclosed herein sense the resonant frequency of the transducer and actuate the transducer at that frequency instead of sweeping the frequency in a range around the expected but unknown actual resonant frequency of the piezoelectric transducer.

All of the embodiments disclosed herein incorporate methods of doing these two things in a cost effective/practical matter.

The half-bridge/full-bridge implementations of the present embodiments are the least expensive implementations for an ASIC; however, these are not the only possible implementations. For example a combination of a transformer and an inductive and capacitive impedance transformation network using a single transistor could be used.

The circuits disclosed herein also implement methods of sensing the correct resonant frequency of the piezoelectric transducer. These include the:

1. direct feedback method, which has no independent oscillator per se absent the sensing circuitry, but when combined with other circuits transforms the entire circuit into an oscillator;
2. the PLL and synchronous oscillator, either of which can be used to lock to the correct transducer frequency; and
3. the dither method, which uses an independent oscillator and "dithers" the frequency of the oscillator to find the maximum current through the transducer.

In the present embodiments the feedback mechanisms sense the current through the transducer, for example, as developed across one or more resistances or diodes. The resistance may be a separate resistor or may be the parasitic resistance of the driver transistors.

Except for the direct feedback method the oscillator frequency may be either voltage controlled or digitally synthesized. The balance of the circuitry in the embodiments has two purposes: to generate the supply voltages required for proper operation of all the circuits, and to provide a user interface to control when and how long the piezoelectric transducer is activated, Referring to FIG. 1, a drive circuit 120 includes an amplifier/driver circuit 122 coupled to a tank circuit 124 comprising a piezoelectric actuator 126 and one or more reactive components 128. The component(s) 128 may include resistive and/or other components, as necessary or desirable. A feedback path represented by solid line 130 detects a parameter of power developed across or flowing through one or more of the component(s) 128 and develops a feedback signal that is delivered to the an amplifier portion of the amplifier/driver circuit 122. Alternatively or in addition, a second feedback path represented by dashed line 131 detects a parameter of power developed across or flowing through the piezoelectric actuator 126 and provides a feedback signal that may be provided alone to the amplifier portion of the amplifier/driver circuit 122 or which may be summed or otherwise combined with one or more other feedback signals, including, possibly, the feedback signal on the line 130, and provided to the circuit 122.

The piezoelectric actuator 126 may comprise, for example, a piezoelectric element that is a part of a fragrance or other volatile dispensing device. For example, the device may comprise a fragrance dispensing device sold by the assignee of the present application under the WISP® trademark. The piezoelectric element vibrates a perforated orifice plate that is disposed in fluid contact with a liquid conducted by a capillary wick forming a part of a replaceable fluid reservoir. Such a device is disclosed in Boticki et al. U.S. Pat. No. 6,843,430, filed May 24, 2002, owned by the assignee of the present application, the disclosure of which is hereby incorporated by reference therein. Alternatively, the piezoelectric actuator may be used to dispense a different volatile material, such as an insecticide, or may produce useful work other than dispensing a volatile material, as desired. For example, the present invention could alternatively be utilized in any of the devices disclosed in U.S. application Ser. No. 11/427,714, filed Jun. 29, 2006, entitled "Apparatus for and Method of Dispensing Active Materials," U.S. application Ser. No. 11/131,718, filed May 18, 2005, entitled "Diffusion Device and Method of Diffusing," U.S. application Ser. No. 11/264, 952, filed Nov. 2, 2005, entitled "Control and Integrated Circuit for a Multisensory Apparatus," U.S. application Ser. No. 11/401,572, filed Apr. 11, 2006, entitled "Electronic Aerosol Device," U.S. application Ser. No. 11/457,728, filed Jul. 14, 2006, entitled "Diffusion Device," owned by the assignee of the present application and the disclosures of which are hereby incorporated by reference herein.

The remaining FIGS. illustrate various embodiments according to FIG. 1. In each of the embodiments disclosed herein, the reactive component 128 comprises an inductor L1 preferably coupled in series with the piezoelectric actuator 126, although a combination of reactive components (i.e., inductor(s) and/or capacitor(s) connected in series and/or parallel relationship and/or in a combination of series and/or parallel relationships) and/or resistive and/or even nonlinear components could also be used.

Figure 2:
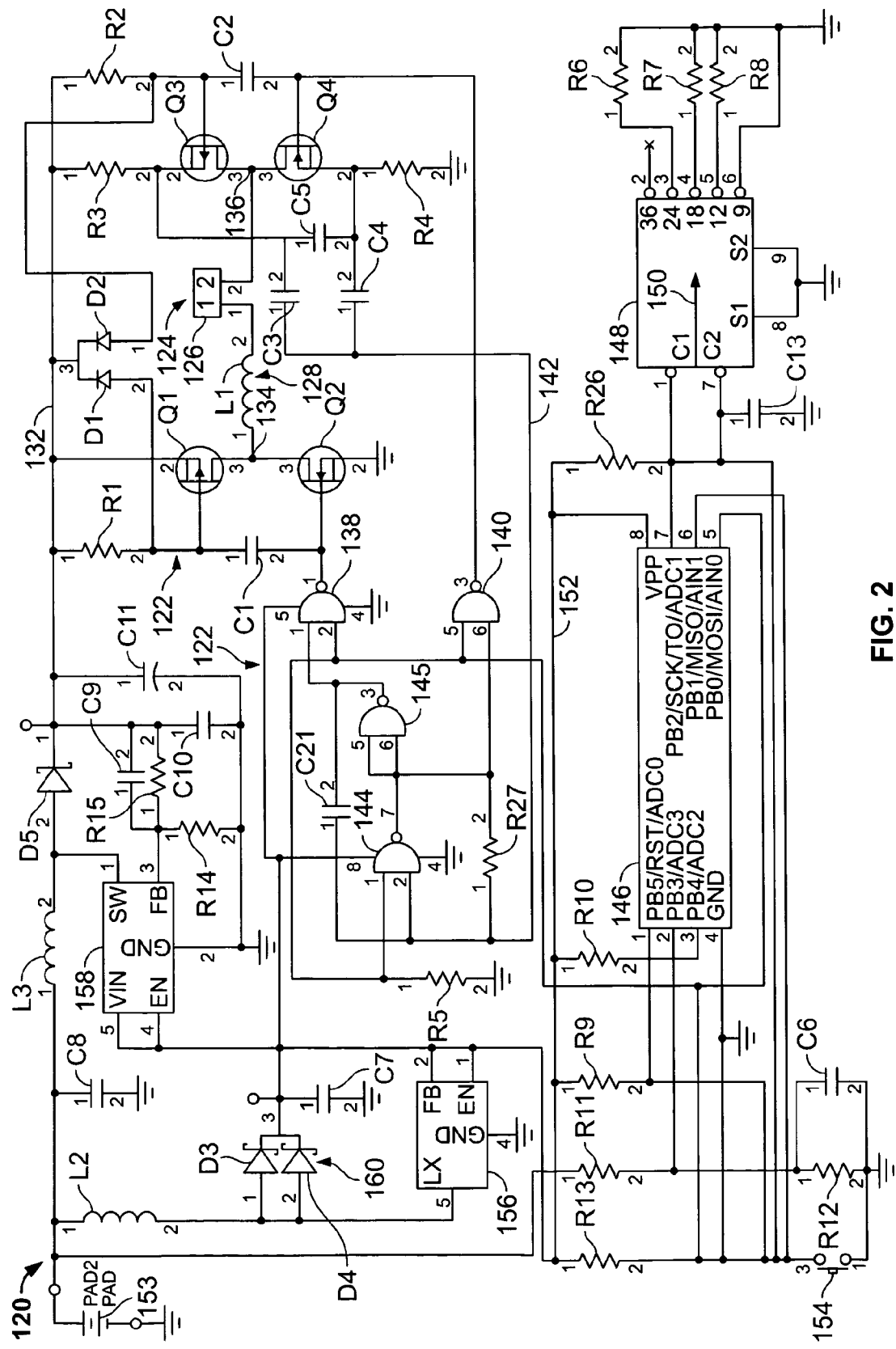
FIG. 2 is a schematic diagram of a first embodiment of the drive circuit of FIG. 1.

Referring next to FIG. 2. the amplifier/driver circuit 122 includes four transistors Q1-Q4 coupled in a full-bridge configuration between a regulated voltage developed on a line 132 and ground potential. The series combination of the inductor L1 and the piezoelectric actuator 126 is coupled across junctions 134, 136 between drain electrodes of the transistors Q1, Q2 and Q3, Q4, respectively. Resistors R1 and R2 are coupled between the line 132 and gate electrodes of the transistors Q1 and Q3, respectively. Capacitors C1 and C2 are coupled between the gate electrodes of the transistors Q1, Q2 and Q3, Q4, respectively. The gate electrode of the transistor Q2 is coupled to an output of a first NAND gate 138 and the gate electrode of the transistor Q4 is coupled to an output of a second NAND gate 140, In addition, diodes D1 and D2 are coupled between the gate electrodes of the transistors Q1 and Q3, respectively, and the line 132. The capacitor C1, the diode D1, and the resistor R1 form a self biasing, DC coupled level shifter to drive the P-FET transistor Q1 from the low voltage signal from the NAND gate 138. In like fashion, the capacitor C2, the diode D2, and the resistor R2 form a self biasing, DC coupled level shifter to drive the P-FET transistor Q3 from the low voltage signal from the NAND gate 140.

First and second current sensors in the from of resistors R3 and R4 are coupled between source electrodes of the transistors Q3 and Q4, respectively, and the line 132 and ground potential, respectively. Feedback capacitors C3-C5 are coupled between the source electrodes of the transistors Q3 and Q4 and a feedback line 142 comprising the feedback path 130. The feedback signal is phase shifted for proper operation of the amplifier/driver circuit 122.

The amplifier/driver circuit 122 further includes third and fourth NAND gates 144, 145, respectively. A first input of the third NAND gate 144 receives the signal on the feedback line 142. The NAND gate 144 is biased into a linear range of operation by a resistor R27. A second input of the third NAND gate 144 receives a gating signal developed across a resistor R5 and transmitted by a pin 5 of an ATTINY13 microprocessor 146 manufactured by Atmel. The microprocessor 146 is, in turn, responsive to the setting of a rate selector switch 148, which can be set to one of five settings. A wiper 150 of the switch 148 can be connected to one of five pins 2-6 of the switch 148. The pin 2 is disconnected from all sources of potential whereas the pins 3-5 are connected to three resistors R6-R8 forming a voltage divider. The pin 6 is coupled to ground potential. The setting of the switch 148 determines the duration of a dwell period during which the piezoelectric actuator 126 is not actuated. The dwell periods are separated by emission sequences preferably of fixed duration. Preferably, each emission sequence is about 12 milliseconds in length, and the dwell periods are selectable to be about 5.75 seconds, 7.10 seconds, 9.22 seconds, 12.60 seconds, or 22.00 seconds in length. In other embodiments, these dwell periods are selectable to be about 9.22 seconds, 12.28 seconds, 17.92 seconds, 24.06 seconds, or 35.84 seconds in length or 5.65 seconds, 7.18 seconds, 9.23 seconds, 12.81 seconds, or 22.54 seconds in length. Any emission sequence duration and any dwell period durations could be used and the number of selectable dwell period durations and multiple selectable emission sequence durations of any number could be implemented. A pin 7 is coupled to the wiper 150 and is further coupled by a resistor R26 to a line 152 that receives a voltage VPP developed at a pin 8 of the microprocessor 146. The pin 7 of the microprocessor 146 is further coupled by a capacitor C13 to ground potential and the voltage on the pin 7 is sensed by an internal A/D converter of the microprocessor 146 to read the setting of the switch 148.

Alternatively, the dwell period(s) may be predetermined to be anywhere in a range from 12 mS up to 30 minutes or longer. For example in a boost mode, when it is desired to release a large amount of fragrance, each emission sequence could be 12 mS and each dwell period could be 12 mS in duration to achieve a 50% duty cycle. On the other extreme, when the room in which the volatile dispensing device is located is unoccupied (as detected by a motion sensor or other sensor, for example, as seen in the embodiments hereinafter) it might be desirable to emit volatile for a 12 mS duration once every 30 minutes just to maintain some volatile in the room. As noted in greater detail hereinafter, this periodic emission of volatile at a selectable rate may be overridden by a command to emit volatile at an accelerated rate on a periodic or aperiodic basis.

Pins 1 and 3 of the microprocessor 146 are coupled by resistors R9 and R10, respectively, to the line 152, A pin 2 of the microprocessor 146 is coupled by a resistor R11 to a battery 153, which may be a single 1.5 volt AA alkaline battery. The pin 2 is also coupled by a resistor R12 to ground potential. A capacitor C6 is coupled in parallel across the resistor R12. A switch 154 is coupled between a pin 6 of the microprocessor 146 and ground potential, and is further coupled by a resistor R13 to further integrated circuits 156, 158 that function to develop regulated voltages for power supply purposes. The switch 154 is also coupled to a power conditioning circuit 160 in the form of a pair of parallel-connected schottky diodes D3, D4, an inductor L2 coupled to an anode of the battery, and a capacitor C7.

The IC 156, the diodes D3 and D4, the inductor L2, and the capacitor C7 act as a switching regulator that steps up and regulates the battery voltage to 2.7 volts. This regulated voltage is delivered to the NAND gates 144 and 138. The integrated circuit 158 and voltage regulation components C8-C11, R14, R15, L3, andD5 together produce the regulated voltage of preferably 9.6 volts on the line 132.

When power is supplied to the microprocessor 146 by, the battery 153 the microprocessor 146 periodically develops an approximate 12 millisecond gating signal on the pin 5. The gating signal is delivered to inputs of the NAND gates 138, 140, and 144. This signal causes the NAND gates 138, 140, 144, and 145, together with a resistor R27 and a capacitor C21 to provide drive signals to the gate electrodes of the transistors Q1-Q4. In this regard, the NAND gate 145 acts as an inverter to invert the output of the NAND gate 144 so that the transistors Q1 and Q2 are driven 180° out of phase with respect to the transistors Q3 and Q4. That is, the transistors Q1 and Q4 are first turned on while the transistors Q2 and Q3 are held in an off condition, and subsequently the transistors Q1 and Q4 are turned off and the transistors Q2 and Q3 are turned on. Preferably, the transistors are operated at about 50% duty cycle. If desired, a period of time may be interposed between turn-off of one pair of transistors and turn-on of another pair of transistors during which all transistors are briefly turned off to prevent cross-conduction. In any event, the current through the piezoelectric element 126 alternates at a selected resonant frequency thereof during each gating period (i.e., during the times that the gating signal is developed) dependent upon the impedance of the tank circuit 124. This oscillation continues in a continuous fashion during each approximate 12 millisecond emission sequence, following which the integrated circuit 146 terminates the gating signal on the pin 5 thereof, hereby turning off the transistors Q1-Q4 and terminating further emission of product by the piezoelectric actuator 126.

When a user wishes to activate the circuitry 120 during operation referred to as a "boost" mode, the user depresses the switch 154. This action pulls the voltage on the pin 6 of the microprocessor 146 low and causes the microprocessor 146 to develop the gating signal on the pin 5. In one embodiment, the gating signal is periodically or aperiodically developed during an interval. For example, the gating signal may cause volatile emission comprising one 12 mS pulse every second for 83 or 84 seconds. As another example the gating signal may cause volatile emission comprising a group of ten 12 mS pulses spaced apart from one another by 72 mS, wherein successive groups of ten 12 mS pulses take place at intervals of sixty seconds. This sequence may continue for any length of time. As should be evident, any number of pulses of any duration can be periodically or, aperiodically emitted at any desired frequency (if periodic) and over one or more intervals of any length, as desired. In yet another embodiment, the gating signal is developed for as long as the switch 154 is depressed so that volatile is emitted in a continuous fashion during the entire time that the switch 154 is depressed. In any event, the actuator 126 oscillates at the selected resonant frequency during the entire time that the gating signal is developed, although the actuator 126 may be intermittently actuated during the time that the gating signal is developed, if desired.

Figure 3:
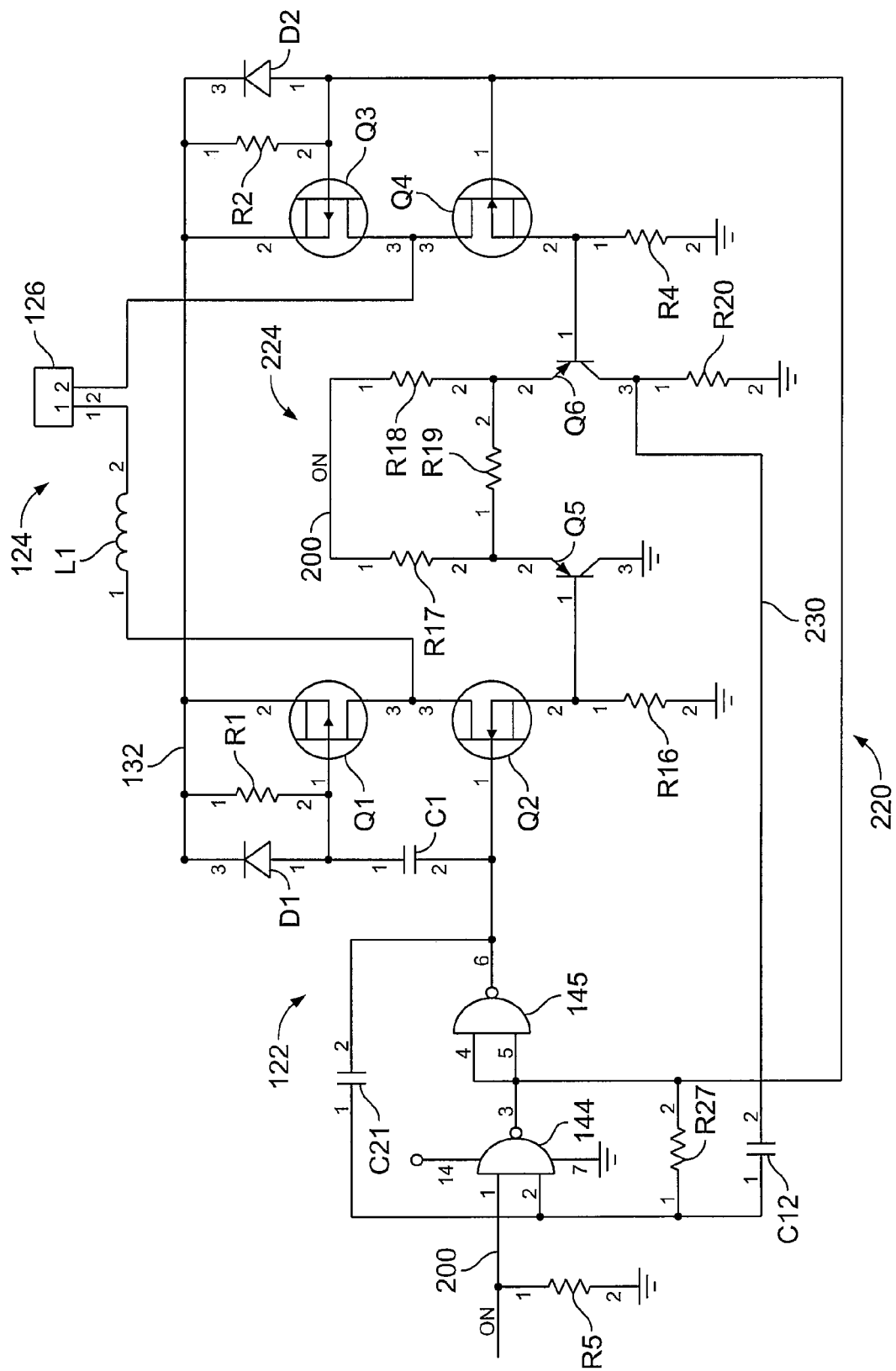
FIG. 3 is a schematic diagram of a second embodiment of the drive circuit of FIG. 1.

Referring next to FIG. 3, a further embodiment will next be described. The primary difference between the embodiment of FIG. 2 and the embodiment of FIG. 3 involves the manner in which the current following through the lank circuit 124 is sensed and other details, as described in greater detail hereinafter. In addition to the foregoing, the voltage regulation circuitry and the integrated circuit 146 illustrated in FIG. 2 are not shown in FIG. 3, it being understood that the voltage on the line 132 is developed by similar or identical circuitry to that described in connection with FIG. 2 and the gating signal described above is developed on a line 200.

A drive circuit 220 of FIG. 3 includes a current sensing circuit 224 coupled to the resistor 114 and to a resistor R16 coupled between the source electrode of the transistor Q2 and ground potential. The current sensing circuit 224 includes a pair of transistors Q5, Q6, resistors R17, R18 coupled to emitter electrodes of the transistors Q5 and Q6, and a further resistor R19 coupled between the emitter electrodes of the transistors Q5 and Q6. Ends of the resistors R17 and R18 opposite the resistor R19 are coupled to the line 200 and receive the gating signal developed thereon. In addition to the foregoing, a collector electrode of the transistor Q6 is coupled by a resistor R20 to ground potential. A junction between the collector electrode of the transistor Q6 and the resistor R20 is coupled by a capacitor C12 to one input of the NAND gate 144. As in the embodiment of FIG. 2, a second input of the NAND gate 144 receives the gating signal on the line 222. The transistors Q5 and Q6 and the resistors R16-R20 form a differential-to-single ended amplifier to combine the two feedback signals across R16 and R20 into one signal on a line 230.

The NAND gates 138, 140 of FIG. 2 are not utilized in the embodiment of FIG. 3; instead, the output of the NAND gate 145 is provided directly to the gate electrode of the transistor Q2 and to the gate electrode of the transistor Q1 via the capacitor C1. Further, the output of the NAND gate 144 is provided directly to the gate electrodes of the transistors Q3 and Q4. A capacitor C21 is connected between one of the inputs of the NAND gate 144 and the output of the NAND gate 145 to provide hysteresis so that unstable switching is minimized or avoided.

During an emission sequence when the gating signal is developed on the line 200 in the fashion noted above in connection with FIG. 2, the NAND gates 144, 145 drive the transistors Q1-Q4 in anti-phase relationship such that when the transistors Q1 and Q4 are on, the transistors Q2 and Q3 are off and when the transistors Q1 and Q4 are off, the transistors Q2 and Q3) are on (with the possible exception of a brief period of time between turn-off of one pair of transistors and turn-on of the other pair of transistors during which all of the transistors are off). The current flowing through the tank circuit 124 is at a frequency equal to a resonant frequency of the piezoelectric actuator 126, as also noted above. The current flowing through the piezoelectric actuator 126 in either direction (for example, when the transistors Q1 and Q4 are on) is sensed by the current sensing circuitry 224, which is active when the gating signal is developed on the line 200. Specifically, when current is flowing through the piezoelectric actuator 126 in either direction and during the time that the gating signal on the line 200 is on, the transistors Q5 and Q6 are turned on, thereby causing a feedback signal to be developed on the line 230 that is coupled through the capacitor C12 to the NAND gate 144. This feedback signal operates in conjunction with the transistors Q1-Q4 to cause the current flowing through the piezoelectric actuator 126 to be at a selected resonant frequency of the actuator 126, as in the embodiment of FIG. 2. In this regard, the current flow through the actuator 126 is self-resonant in the sense that noise in the system is sufficient to establish the current flow at the resonant frequency, also as in the embodiment of FIG. 2.

Figure 4:
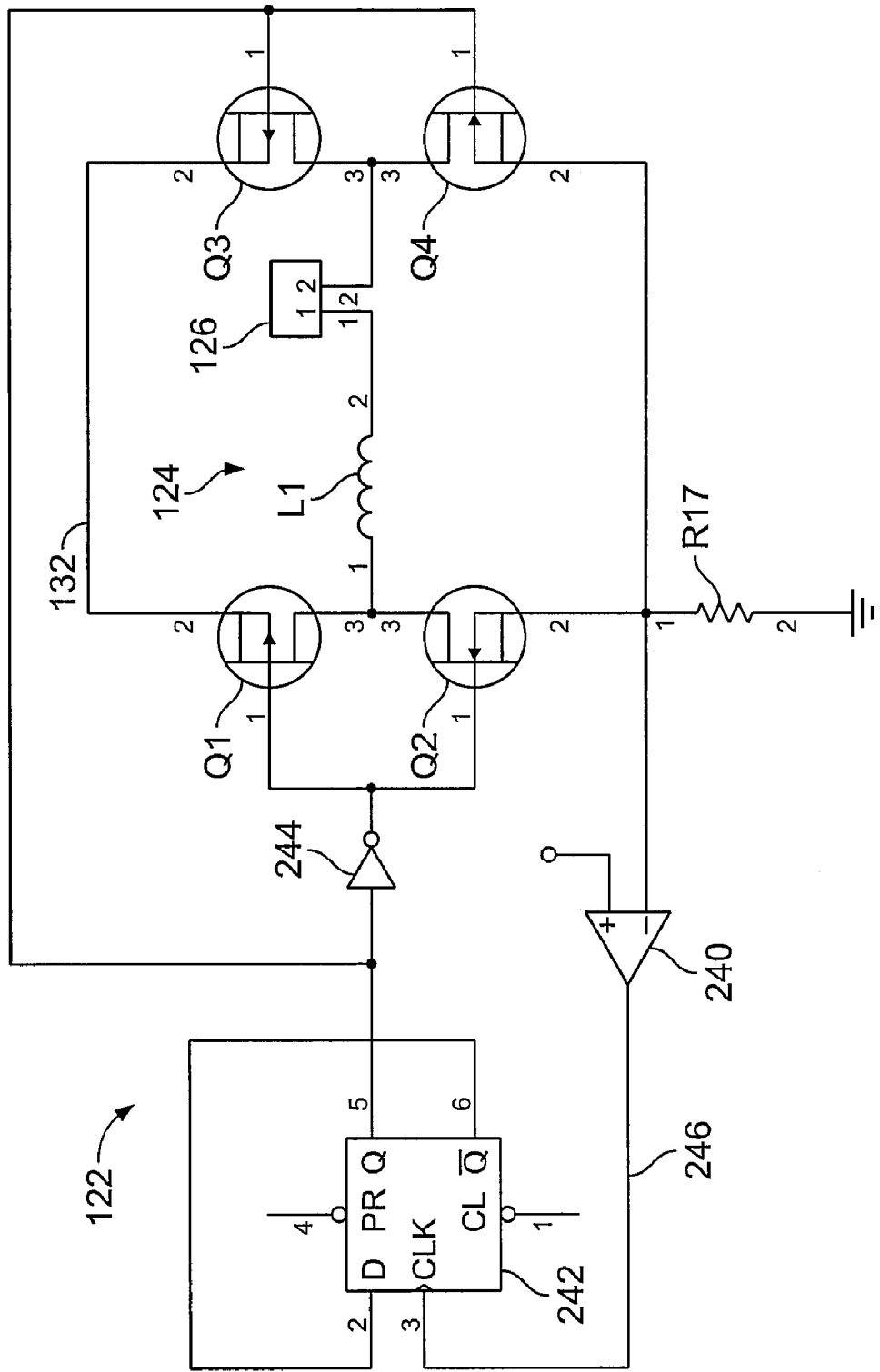
FIG. 4 is a schematic diagram of a third embodiment of the drive circuit of FIG. 1.

FIG. 4 illustrates another embodiment wherein the power regulation circuitry and the integrated circuit 146 that generates the gating signal on the line 200 are not shown for the sake of simplicity. Current sensing in this embodiment is accomplished by a resistor R17, which is coupled to the source electrodes of the transistors Q2 and Q4, and an operational amplifier (op amp) 240. Specifically, an inverting input of the op amp 240 is coupled to the resistor R17 and a non-inverting input thereof is coupled to a source of voltage, for example 10 millivolts. An output of the op amp 240 is coupled to a clock input of a D flip-flop 242. A Q(bar) output of the flip-flop 242 is coupled to the D input thereof and a Q output of the flip-flop 242 is coupled to and directly controls the gate electrodes of the transistors Q3 and Q4. An inverter 244 also receives the Q output of the flip-flop 242 and the resulting inverted driver signal is coupled to the gate electrodes of the transistors Q1 and Q2 to control same. The feedback signal developed across the resistor R17 in this case is at twice the frequency of the current flowing through the piezoelectric actuator 126, i.e., each half-cycle of the current waveform through the actuator 126 produces a positive half sine wave across the resistor R17. The flip-flop242 divides the frequency of this signal by two back to the correct frequency. An alternate circuit would be to omit the inverter 244 and connect the gate electrodes of the transistors Q1 and Q2 to the Q(bar) output of the flip-flop 242.

Although not shown, the flip flop 242 includes set and reset inputs, either of which receives the gating signal developed on the line 200. As in the previous embodiments, the transistors Q1 and Q4 are operated together in 180° opposition to the transistors Q2 and Q3 and a feedback signal is developed on a line 246 and is provided to the clock input of the flip-flop 242 to control same. The current through the piezoelectric actuator 126 flows at a frequency equal to a selected resonant frequency thereof as in the previous embodiments Further, in any of the embodiments described herein the FET's shown in the drawings may be replaced by any other suitable switching devices, such as bipolar transistors, in which case flyback diodes may be coupled in anti-parallel relationship across main current path electrodes of the switching devices.

Figure 5:
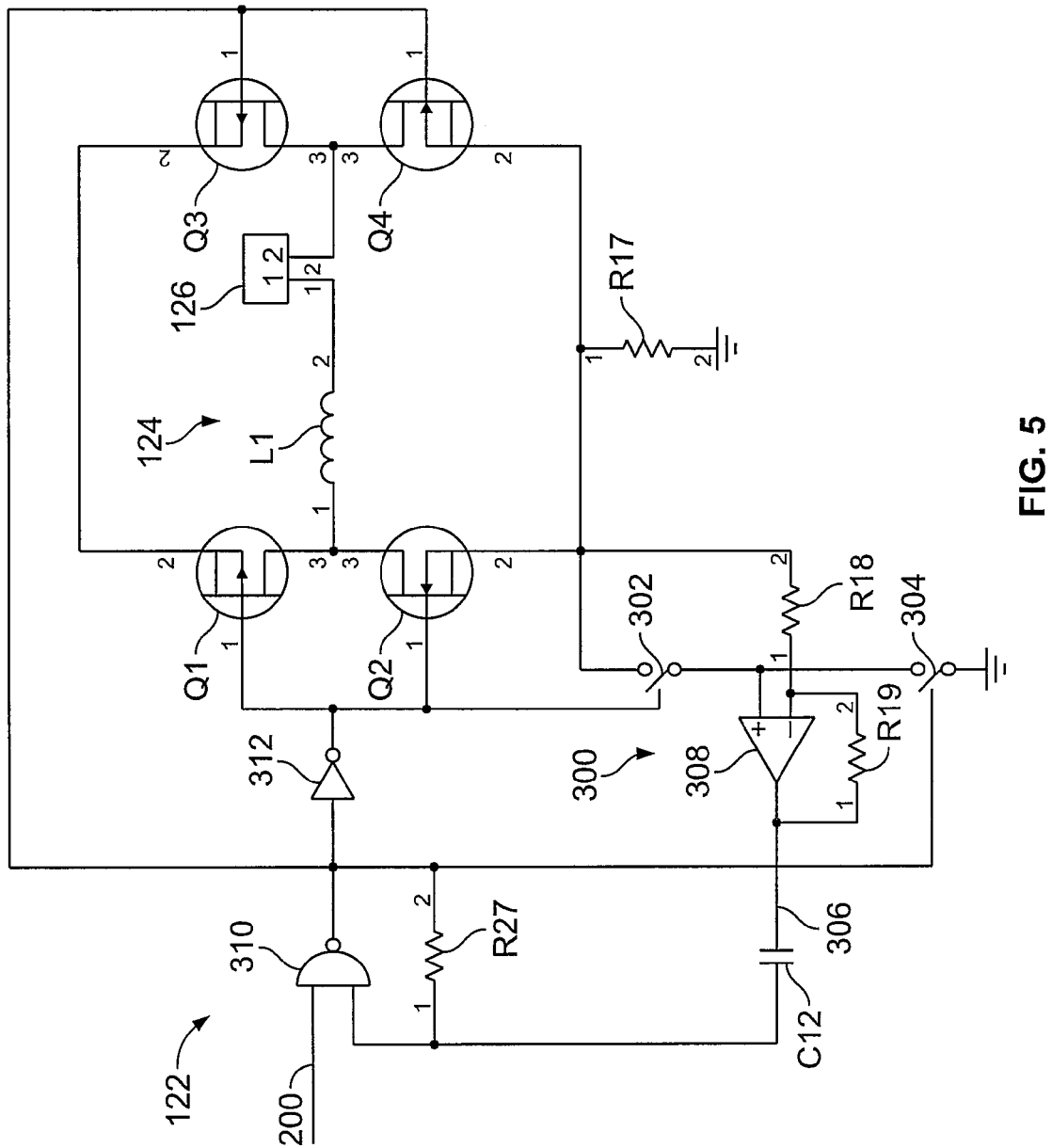
FIG. 5 is a schematic diagram of a fourth embodiment of the drive circuit of FIG. 1.

Referring next to FIG. 5, yet another embodiment is illustrated wherein the current flowing in each direction through the piezoelectric actuator 126 is sensed by circuitry 300 coupled across the resistor R17. The circuitry 300 includes first and second controllable switches 302, 304 that are driven in anti-phase relationship with respect to one another so that a feedback signal is developed on a line 306 during an emission sequence. Specifically, when the transistors Q1 and Q4 are rendered conductive, the switch 302 is closed and the switch 304 is opened so that an op amp 308 receives a high-state signal at a non-inverting input thereof that causes the op amp 308 and associated resistors R18 and R19 coupled to an inverting input of the op amp to act as an amplifier having a positive unity gain. The voltage across the resistor R17, representing the current flowing through the piezoelectric element 126 and the transistors Q1 and Q4, is passed in un-inverted form through the feedback line 306 and the capacitor C12 to one input of a NAND gate 310. A second input of the NAND gate 310 receives the gating signal on the line 200. The output of the NAND gate 310 is directly coupled to the gate electrodes of the transistors Q3 and Q4 and is further coupled through an inverter 312 to the gate electrodes of the transistors Q1 and Q2.

When the NAND gate 310 turns the transistors Q1 and Q4 off and turns the transistors Q2 and Q3 on, the switch 302 is opened by the inverter 312 and the switch 304 is closed by the NAND gate 310. This action causes the op amp 308 and associated resistors R18 and R19 to operate as an amplifier with a gain of minus unity, and hence, the voltage across the resistor R17 is inverted and delivered through the capacitor C12 to the input of the NAND gate 310.

As should be evident from the foregoing, the current sensing circuit is operated to provide a feedback signal of proper polarity to the line 306 so that stable operation of the oscillator and piezoelectric actuator 126 is maintained.

Figure 6A:
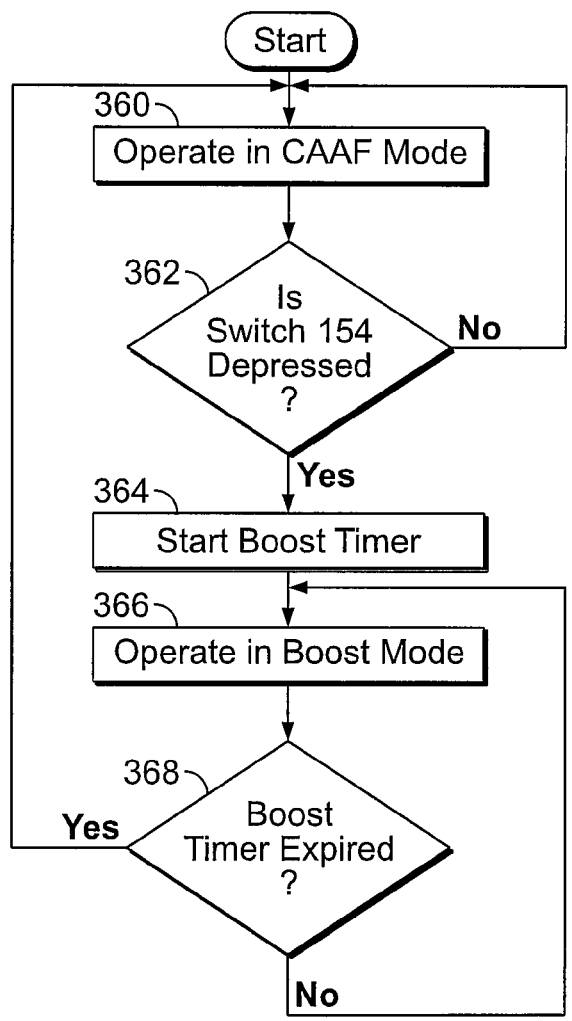
FIG. 6A is a flowchart illustrating operation of the drive circuit of FIG. 6.
Figure 6:
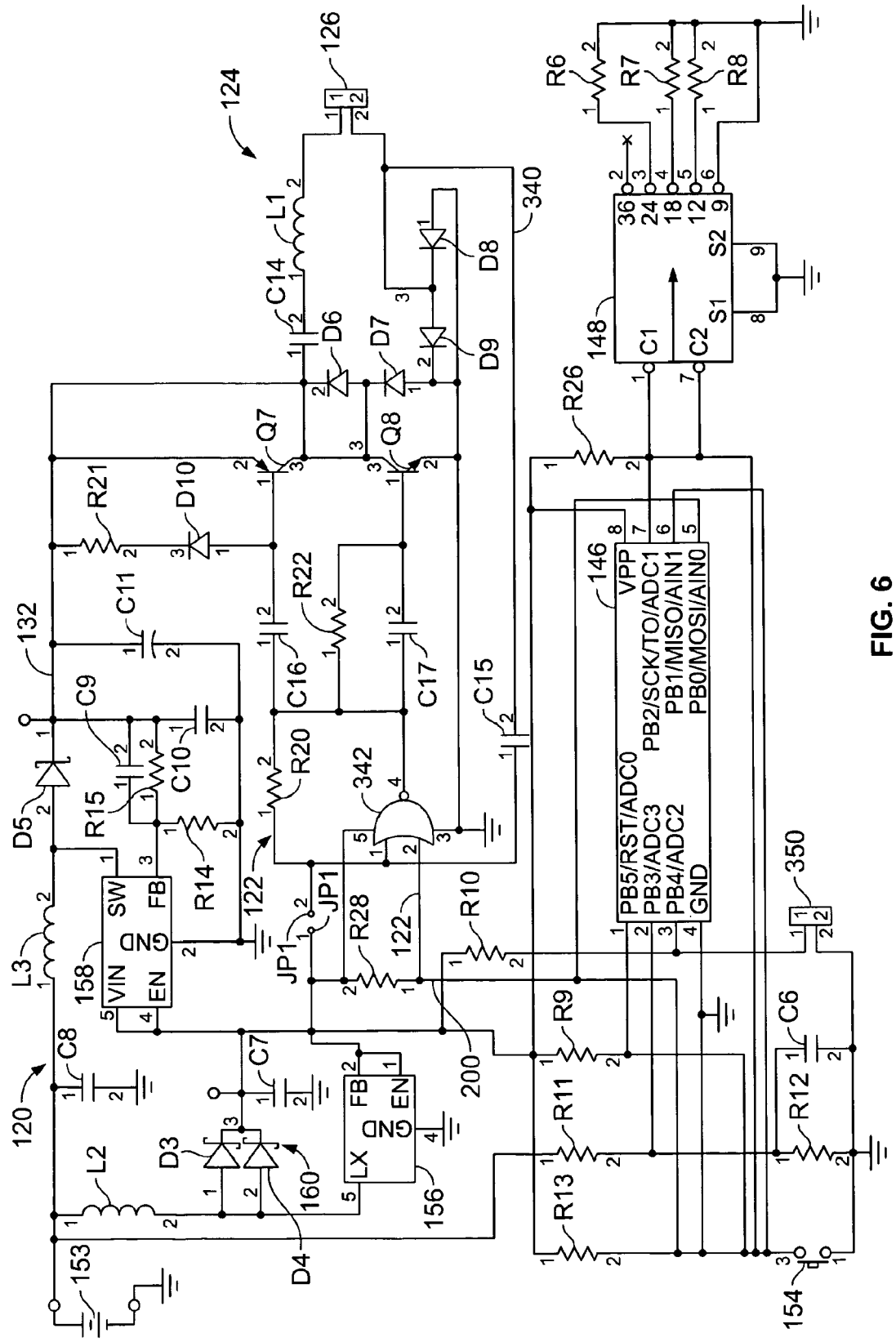
FIG. 6 is a schematic diagram of a fifth embodiment of the drive circuit of FIG. 1.

FIG. 6 illustrates an embodiment wherein the full-bridge topology of FIGS. 2-5 is replaced by a halt-bridge topology including transistors Q7 and Q8. An optional capacitor C14 is coupled in series with the inductor L1 and flyback diodes D6, D7 are coupled in anti-parallel relationship across the transistors Q7, Q8. An end of the piezoelectric actuator 126 opposite the inductor L1 is coupled to a junction between current sensing diodes D8, D9. The second end of the piezoelectric actuator is also coupled by a feedback line 340 to a feedback capacitor C15 and a first input of a NOR gate 342. The feedback signal is also supplied through a resistor R20 and a capacitor C16 to a base electrode of the transistor Q7. The base electrode of the transistor Q7 is further connected by a diode D10 and a resistor R21 to the line 132.

A second input of the NOR gate 342 receives the gating signal on the line 122. An output of the NOR gate 342 is coupled by a parallel combination of a resistor R22 and a capacitor C17 to a base electrode of the transistor Q8.

As in the previous embodiments the amplifier/driver circuit 122 operates the transistors Q7, Q8 in alternating fashion to periodically reverse the current in the piezoelectric element 126. The circuit of FIG. 6 functions to drive the current through the piezoelectric element 126 at a resonant frequency thereof.

If desired, the diodes D8 and D9 can be replaced by a small resistor having a first end coupled to the junction between the actuator 126 and the capacitor C15 and a second end coupled to ground potential to obtain the current sensing function.

The resistors R20-R22, capacitors C16 and C17, and diode D10 are selected to provide appropriate biasing and coupling characteristics to obtain the proper operation of the transistors Q7 and Q8.

A jumper JP1 is open during normal operation. Also, a resistor R28 is a pull-up resistor that holds the NOR gate 342 off during testing, during which the pin 5 of IC 146 is programmed to be an open drain output that can only sink current. This allows an external signal to be applied for testing without opposing the microprocessor output developed at the pin 5 thereof. Also on power up while the microprocessor 146 is internally reset the pull-up resistor R28 ensures that the NOR gate 342 will be off.

A connector 350 is coupled to the pin 3 of the microprocessor 146 and is further coupled through the resistor R10 to the regulated voltage developed by the IC 156. A light sensor such as the light sensor 707 of FIG. 7A described hereinafter, may optionally be coupled to the connector 350. If used, the light sensor operates in conjunction Keith the balance of the circuitry of FIG. 6 in the fashion noted below in connection with FIGS. 7A, 10A, and 10B to detect motion and/or room occupancy and/or the like so that the dwell and/or emission sequence duration(s) are adjusted based on such detected activity.

FIG. 6A illustrates programming executed by the microprocessor 146 of FIG. 6. Control begins at a block 360 upon start up of the circuitry, for example, when the battery 153 is inserted into a pair of opposed battery contacts of a battery holder (not shown). The block 360 implements operation in a continuous action air freshening mode (CAAF) wherein the actuator 126 is periodically actuated such that 12 mS bursts are separated by dwell intervals each of a duration determined by the setting of the switch 148 as described above. A block 362 monitors the state of the switch 154, and as long as such switch is not depressed, control remains with the block 360 so that operation in the CAAF mode continues. On the other hand, if the block 362 determines that the switch 154 is depressed, a block 364 initializes and starts a boost timer. In the preferred embodiment, the boost timer times a predetermined interval, such as 7 seconds. A block 366 then initiates operation in the boost mode, wherein the duty cycle of operation of the actuator 126 is increased to a certain level, such as about 14%, Each duty cycle comprises an approximate 12 mS actuation followed by an approximate 72 mS dwell interval.

These values may be changed as necessary or desirable, A block 368 check to determine if the boost timer has expired. If not, control remains with the block 366. Otherwise, control returns to the block 360 so that operation returns to the CAAF mode.

Figure 7:
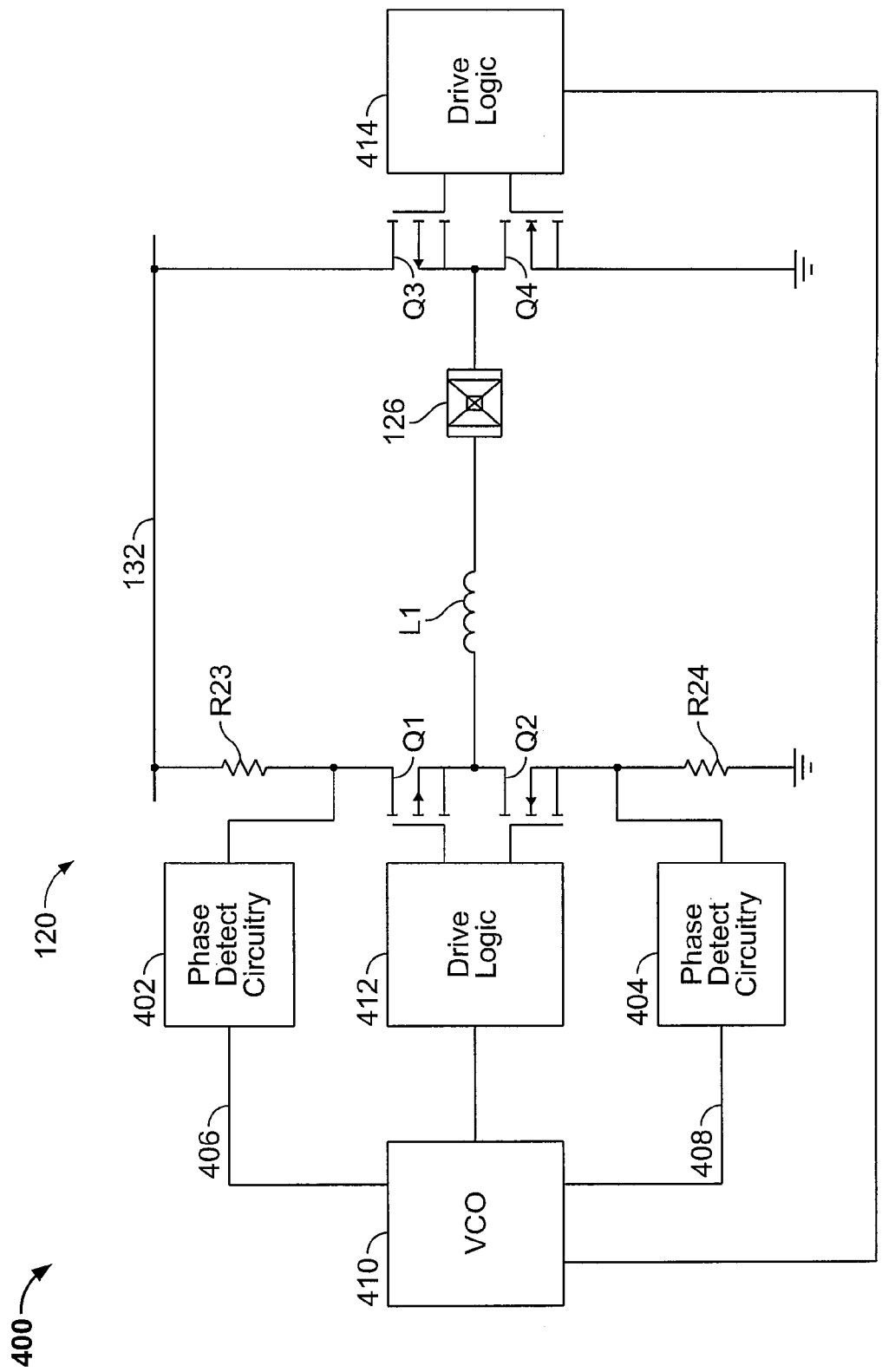
FIG. 7 is a block diagram of a sixth embodiment of the drive circuit of FIG. 1.

FIG. 7 illustrates yet another embodiment where the transistors Q1-Q4, the inductor L1 and the piezoelectric actuator 126 are operated by a phase-locked loop (PLL) 400. The PLL 400 comprises first and second phase detection circuits 402, 404, respectively, that are coupled across resistors R23, R24. The resistor R23 is coupled between the drain electrode of the transistor Q1 and the line 122 whereas the resistor R24 is coupled between a source electrode of the transistor Q2 and ground potential. The phase detect circuits 402, 404 are alternately operable such that the phase detect circuit 402 provides a phase feedback signal on a line 406 when current is flowing through the transistors Q1 and Q4 and the phase detect circuit 404 provides a phase feedback signal on a line 408 when current flow is occurring through the transistors Q2 and Q3. A voltage controlled oscillator (VCO) 410 is responsive to the phase feedback signals developed on the lines 406 and 408 and the gating signal to develop an oscillator signal that is supplied to drive logic circuits 412, 414 that in turn operate the transistors Q1-Q4 in the fashion described above. As in the embodiment of FIG. 8 following, current flow through the actuator 126 occurs at a selected resonant frequency thereof.

Figure 8:
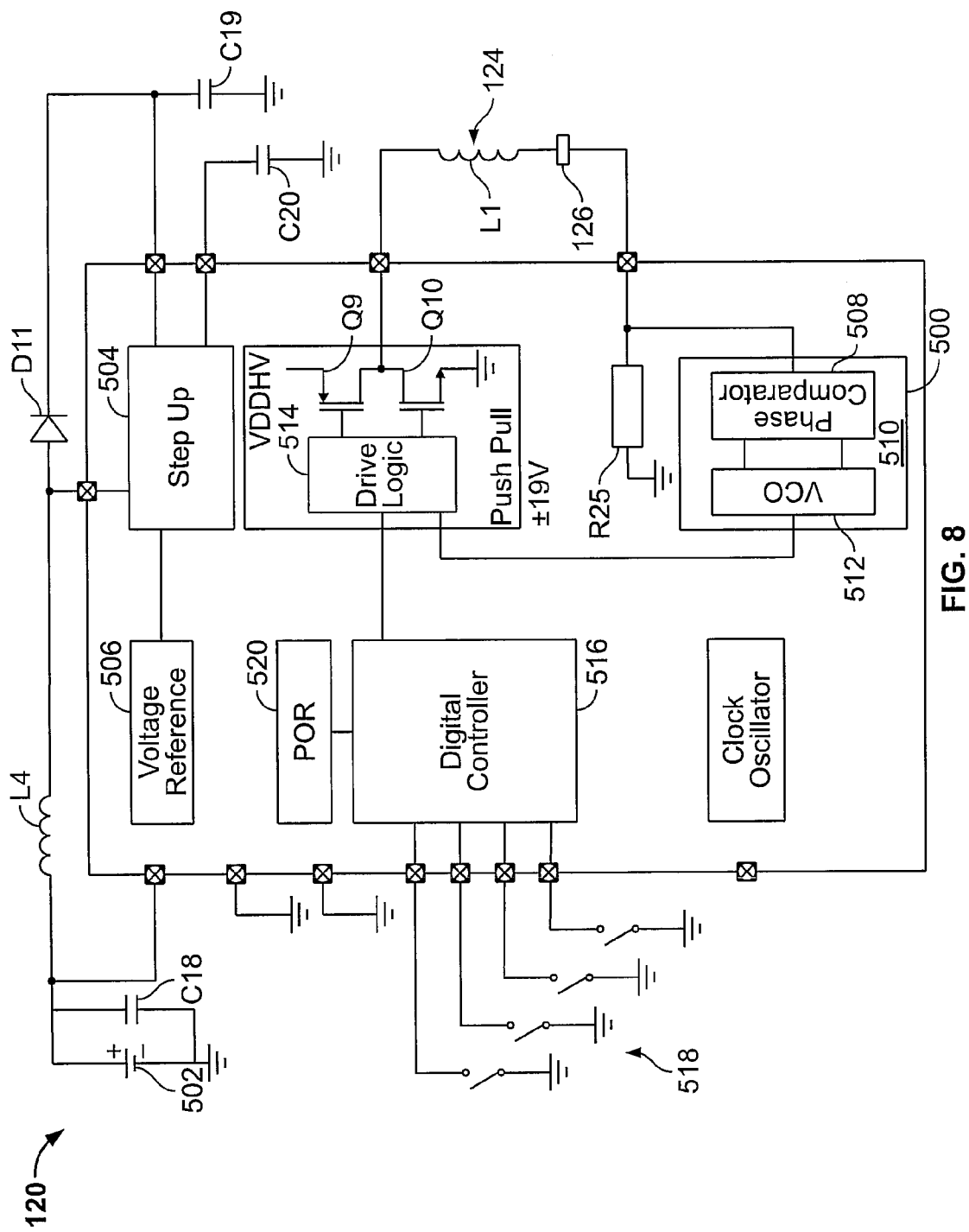
FIG. 8 is a schematic diagram of a seventh embodiment of the drive circuit of FIG. 1.

FIG. 8 illustrates a still further embodiment of a drive circuit 120 that utilizes a half-bridge transistor topology in combination with a phase-locked loop. The embodiment of FIG. 8 is preferably implemented by an application specific integrated circuit (ASIC) 500. A battery 502 supplies power to a capacitor C18 and an inductor L4 and the battery voltage is stepped up to an increased voltage by a boost converter 504 forming a part of the ASIC 500. The boost converter 504 is responsive to a voltage reference developed by a block 506 and the stepped up voltage is delivered through a diode D11 to a capacitor C19 as a boosted voltage VDDHV that is applied to a source electrode of a transistor Q9. A drain electrode of the transistor Q9 is coupled to a drain electrode of the transistor Q10 and a source electrode of the transistor Q10 is coupled to ground potential. A first end of the series combination of the inductor L1 and the piezoelectric actuator 126 is coupled to the drain electrodes of the transistors Q9 and Q10 and a second end of the series combination of the inductor L1 and the piezoelectric actuator 126 is coupled to a current sensing resistor R25. The junction between the piezoelectric actuator 126 and the resistor R25 is coupled through a phase comparator 508 of a PLL 510. The phase comparator 508 is, in turn, coupled to a VCO 512 having an output coupled to a drive logic circuit 514. The drive logic circuit 514 is further responsive to the output of a digital controller 516 that is responsive to a plurality of switches 518 and a parameter of electrical power at a point of regulation (POR) as detected by a sensor 520. If desired, the individual switches 518 may be replaced by the switch 148 of FIG. 2, and, in any event, the switch(es) may be optionally operated to provide a selectable dwell interval between emission sequences as described above. Alternatively, as in some of the preceding embodiments, a boost button may be actuated to override the selectable periodic emission and cause an increased emission of volatile by the actuator 126. In addition, terminals VSS1 and VSS2 are coupled to ground potential and a terminal VDD is coupled to a capacitor C20 to store energy for use by the ASIC 500. The digital controller 516 provides control signals to the drive logic 514 together with the oscillator signal developed by the VCO 512 to operate the switches Q9 and Q10 such that the current flowing through the piezoelectric actuator 126 during an emission sequence is at a frequency equal to a selected resonant frequency thereof.

Figure 9:
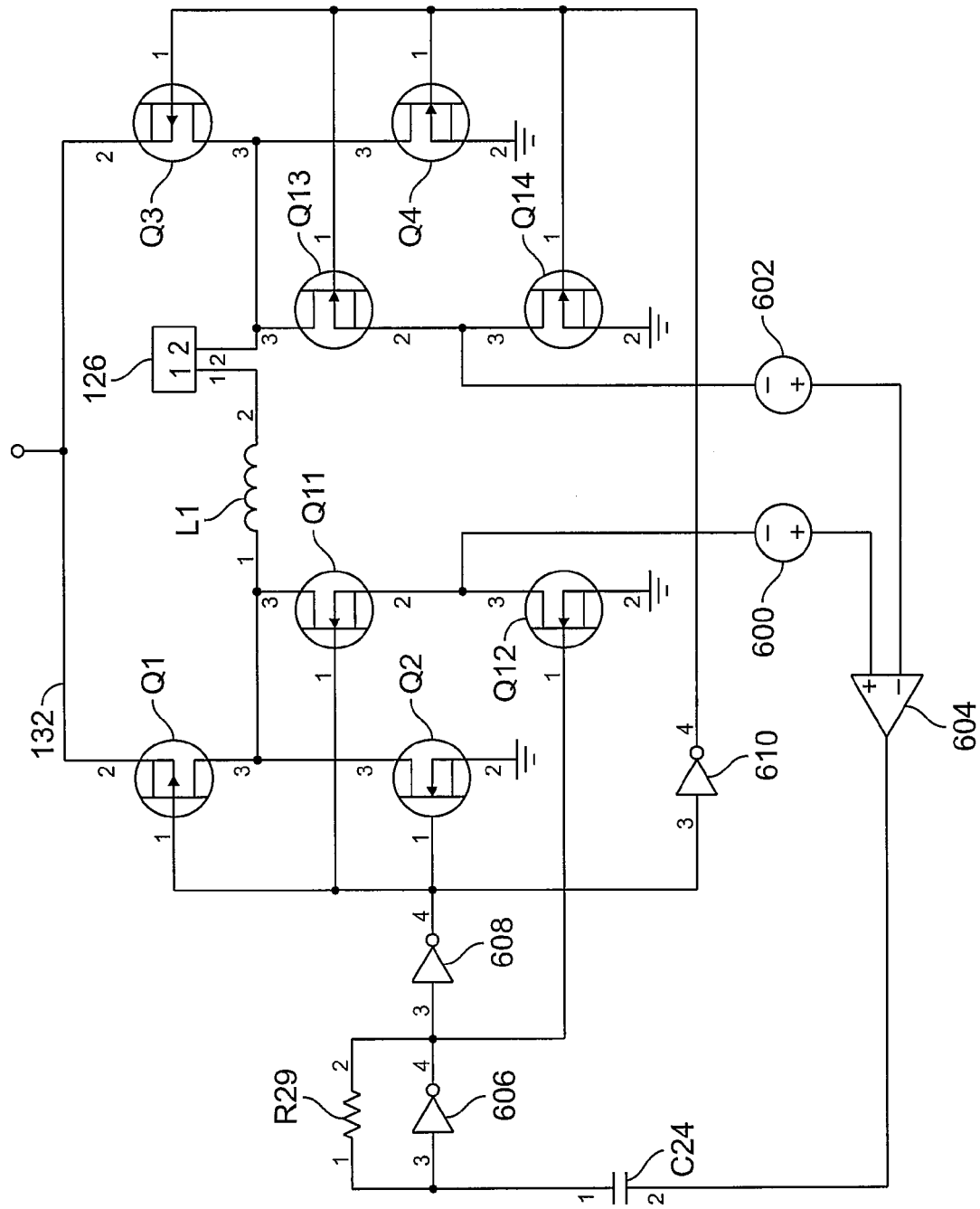
FIG. 9 is a schematic diagram of an eighth embodiment of the drive circuit of FIG. 1.

FIG. 9 illustrates yet another embodiment wherein the on resistances of the driver FET's Q1-Q4 are used as feedback elements. Specifically, transistors Q11 and Q12 are coupled to one end of the series combination of the inductor L1 and the actuator 126 and transistors Q13 and Q14 are coupled to the other end of the series combination of the inductor L1 and the actuator 126. Junctions between the transistors Q11 and Q12 and between the transistors Q13 and Q14 are coupled to voltage biasing circuits 600, 602, which augment the voltages sensed by the transistors Q11-Q14 by approximately 1.5 volts. An op amp 604 acts as a comparator for the signals developed by the circuits 600, 602, and the resulting comparison signal is delivered by a capacitor C24 to inverters 606, 608. The gate 606 may be replaced by a two-input device such as a NAND or NOR gate wherein one of the inputs receives the gating signal and the other input receives the signal transmitted by the capacitor C24. A resistor R29 is coupled across the inverter 606. The signal developed by the inverter 60 is delivered to gate electrodes of the transistor Q12. The signal developed by the inverter 608 is delivered to gate electrodes of the transistors Q1. Q2, and Q1. The signal from the inverter 608 is further delivered by another inverter 610 to gate electrodes of the transistors Q3, Q4, Q13, and Q14. The embodiment of FIG. 9 is operative to cause the current flowing through the actuator 126 at a selected resonant frequency thereof as in the previous embodiments. This implementation requires fewer parts and is more power efficient. The feedback is developed across the two lower drive FET's Q2 and Q4 only.

The circuit could be rearranged to develop the feedback across Q1 and Q3 instead. The feedback FET's connect Q2 to the offset circuit and comparator when Q2 is turned on, and connect the offset circuit and comparator to ground when Q2 is off In a similar fashion the feedback FET's connect Q4 to the offset circuit and comparator when Q4 is turned on, and connect the offset circuit and comparator to ground when Q4 is off. This is a kind of combination of FIGS. 3 and 5, using the FET on-resistance for feedback instead of external resistor(s) or diodes.

Either the offset voltages developed by the biasing circuits 600, 602 or the DC coupling capacitor C24 are needed for DC biasing purposes. Both are not necessary for DC biasing; however, the capacitor C24 along with the resistor R28 is used in most implementations disclosed herein as a high-pass/phase-shift network as well as the DC coupling/bias circuit.

Although not shown, a synchronous oscillator is another implementation. In a single circuit a synchronous oscillator combines together the functions of an oscillator and a PLL, Such an implementation Call be readily designed to have a limited capture range so that the circuit cannot run at an actuator resonance mode and/or frequency other than those desired.

Figure 7A:
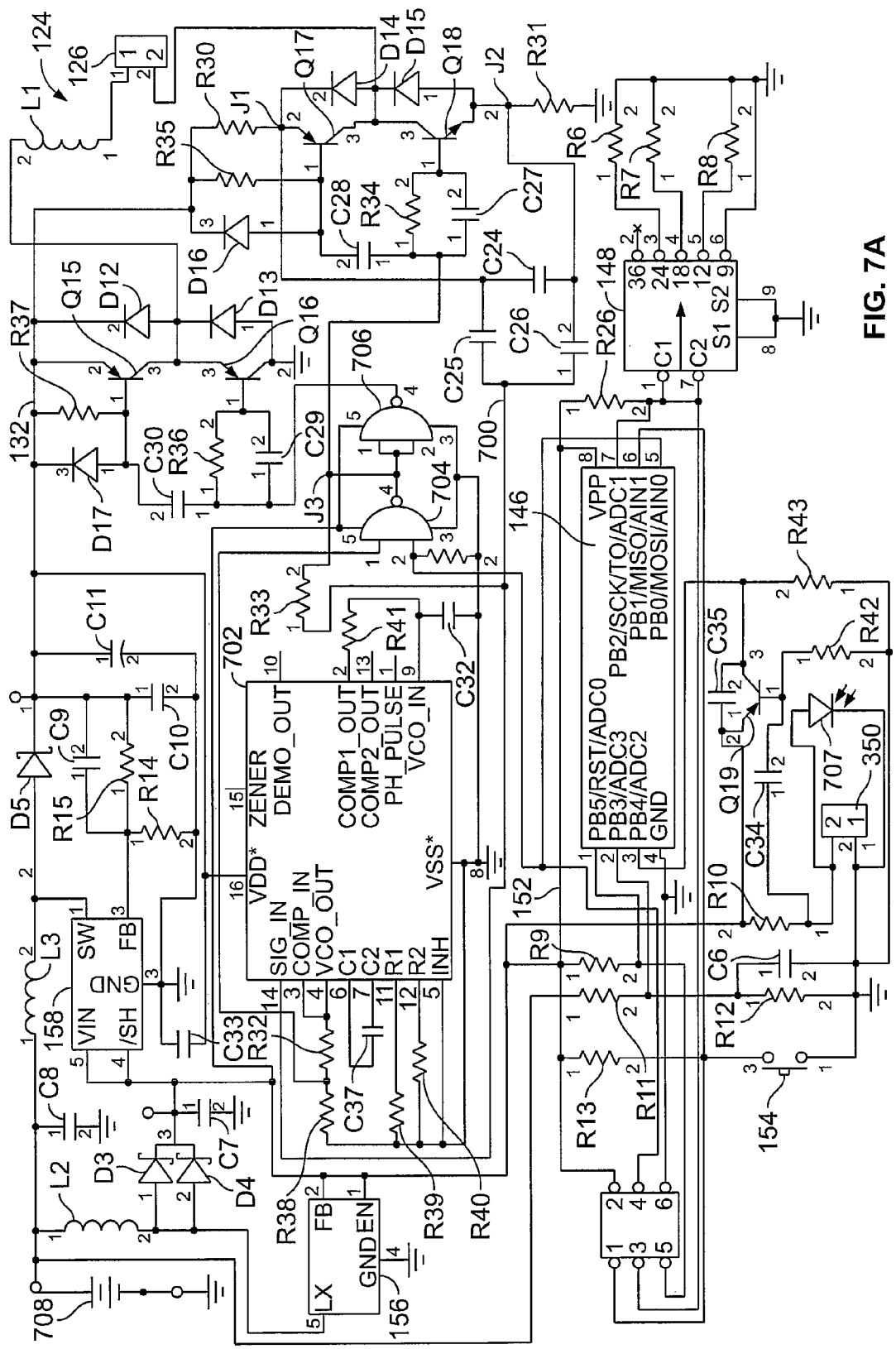
FIG. 7A is an exemplary schematic diagram of the sixth embodiment of FIG. 7.

Referring next to FIG. 7A, an exemplary circuit for implementing the embodiment of FIG. 7 is illustrated in the circuit diagram of FIG, 7A, the FET devices Q1-Q4 are replaced by bipolar transistors Q15, Q16 and Q17, Q18 that are coupled to opposite ends of the series combination of the inductor L1 and the actuator 126. Flyback diodes D12, D13 are coupled in anti-parallel relationship across main current path electrodes of the transistors Q15, 16, and flyback diodes D14, D15 are coupled in anti-parallel relationship across main current path electrodes of the transistors Q17, Q18. An emitter electrode of the transistor Q17 is coupled by a resistor R30 to the line 132 and a further resistor R31 is coupled between an emitter electrode of the transistor Q18 and ground potential. Current sensing signals are developed at junctions J1 and J2, wherein the current sensing signals are provided through capacitors C24-C26 and a feedback line 700 to a pin 14 of a CD4046 Micropower PLL; IC 702 available from Philips, Texas Instruments, Fairchild, or National Semiconductor. A signal VCO_OUT is developed at a pin 4 of the IC 702 and is coupled via a resistor R32 to a first input of a NAND gate 704. A second input of the NAND gate 704 receives the gating signal developed at the pin 5 of the IC 146. An output of the NAND gate 704 is coupled to a junction J3 that further receives the feedback signal on the lines 700 via a resistor R33. A summed signal is developed at the junction J3 that is delivered by coupling and biasing components including capacitors C27, C28, resistors R34, R35, and diode D16 to base electrodes of the transistors Q17, Q18.

The output of the NAND gate 704 is, in turn, coupled to inputs of a further NAND gate 706 that operates as an inverter. An output of the NAND gate 706 is coupled by coupling and biasing components including capacitors C29, C30, resistors R36, R37, and diode D17 to base electrodes of the transistors Q15, Q16, When a gating signal is developed by the microprocessor 146 at the pin 5, the actuator 126 is driven at a selected resonant frequency thereof, as described above in connection with FIG. 7. The use of bipolar transistors Q15-Q18 is shown simply to illustrate that different switching devices could be used, other than the FET'S shown in FIG. 7.

Resistors R38-R41 and capacitors C31 and C32 are coupled to appropriate pins of the IC 702 as shown for proper operation thereof. A pin 16 of the IC 702 is coupled to the line 132 and is further coupled by a capacitor C33 to ground potential and a pin 8 of the IC 702 is coupled to ground so that the IC 702 is properly powered.

In addition to the boost feature afforded by the switch 154 a light sensor in the form of a photodiode or photocell 707 is connected to the connector 350. The photodiode or photocell 707 acts as a motion sensor, Capacitors C34, C35, resistors R42, R43 and a transistor Q19 are coupled to a pin 3 of the microprocessor 146. The transistor Q19 provides gain to the output of the light sensor, the resistors R42, R43 provide biasing, and the capacitors C34, C35 are part biasing and part low-pass/high-pass filters to prevent triggering on very fast or slow changes in light. (The capacitors C34, C35, the resistors R42 and R43, and the transistor Q19 may be used in the embodiment of FIG. 6 if the photodiode or photocell 707 is used in such embodiment.)

The embodiment of FIGS. 7 and 7A automatically operates in the fashion noted in connection with the previous embodiments wherein periodic emission sequences are interposed between dwell intervals selectable by means of the switch 148. At any time, a user may depress the switch 154 to cause operation in the boost mode. The photodiode or photocell 707 detects motion in the vicinity of the device in which the circuitry of FIG. 7A is used to vary the operation in the manner described generally above and more specifically hereinafter.

Figure 12:
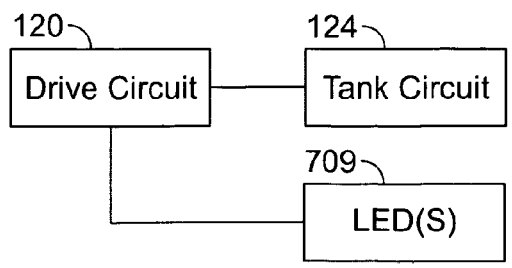
FIG. 12 is a block diagram illustrating use of the drive circuits of any of the embodiments disclosed herein in conjunction with one or more LED's.

If desired, actuation of the switch 154 to implement the boost mode may further cause an LED) or other device to be energized. Specifically, referring to FIG. 12, the embodiment of FIG. 7A, or any of the embodiments of the drive circuits 120 disclosed herein, may not only drive the tank circuit 124, but may further drive one or more LED's 709. The LED may be provided an energization waveform that causes the LED to appear to flicker and thereby emulate a candle in the fashion disclosed in U.S. application Ser. No. 11/264,952, filed Nov. 2, 2005, entitled "Control and Integrated Circuit for a Multi-sensory Apparatus," incorporated by reference above.

Figure 10A:
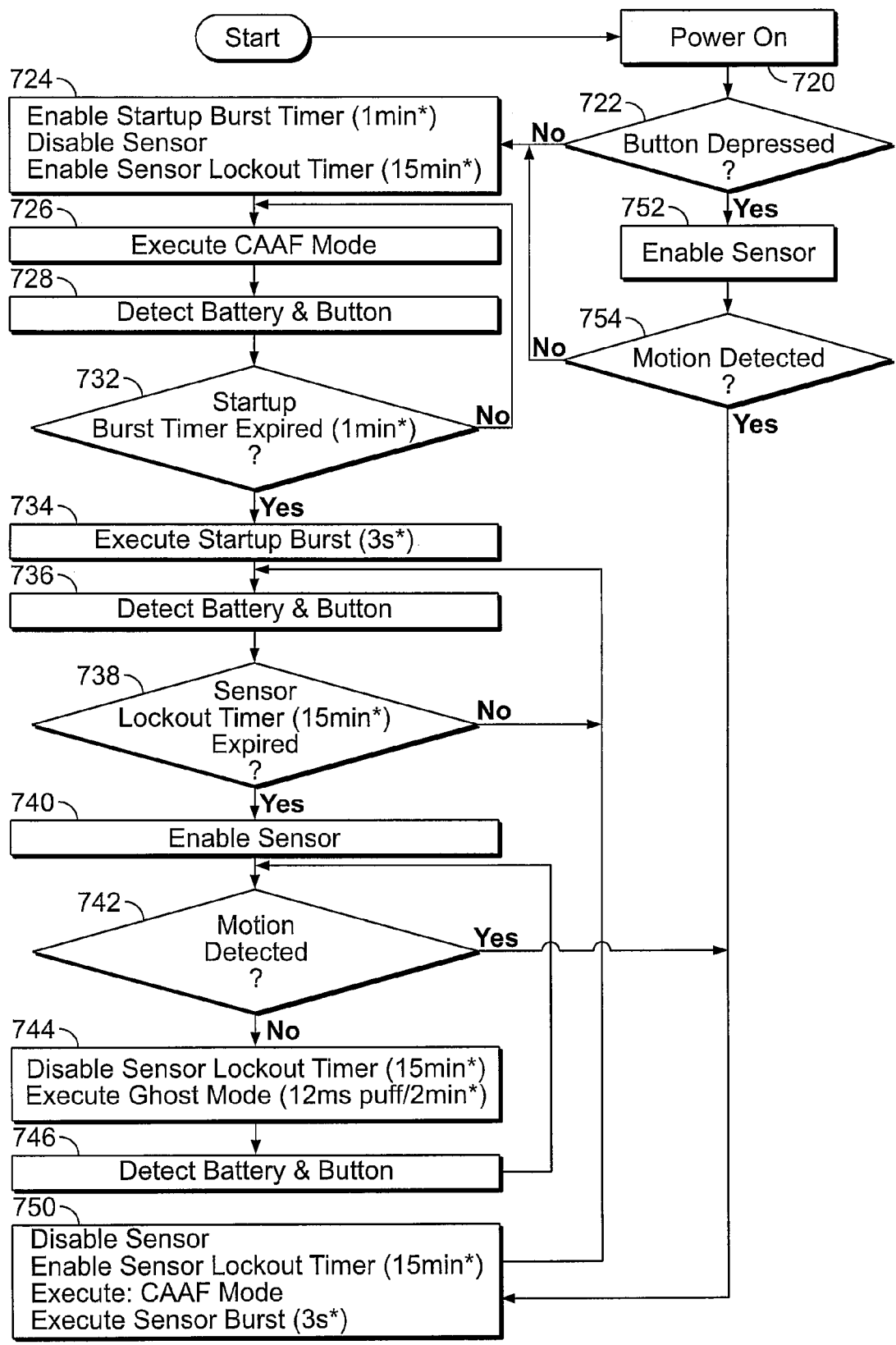
FIGS. 10A and 10B are flowcharts illustrating operation of the circuit of FIG. 7A.
Figure 10B:
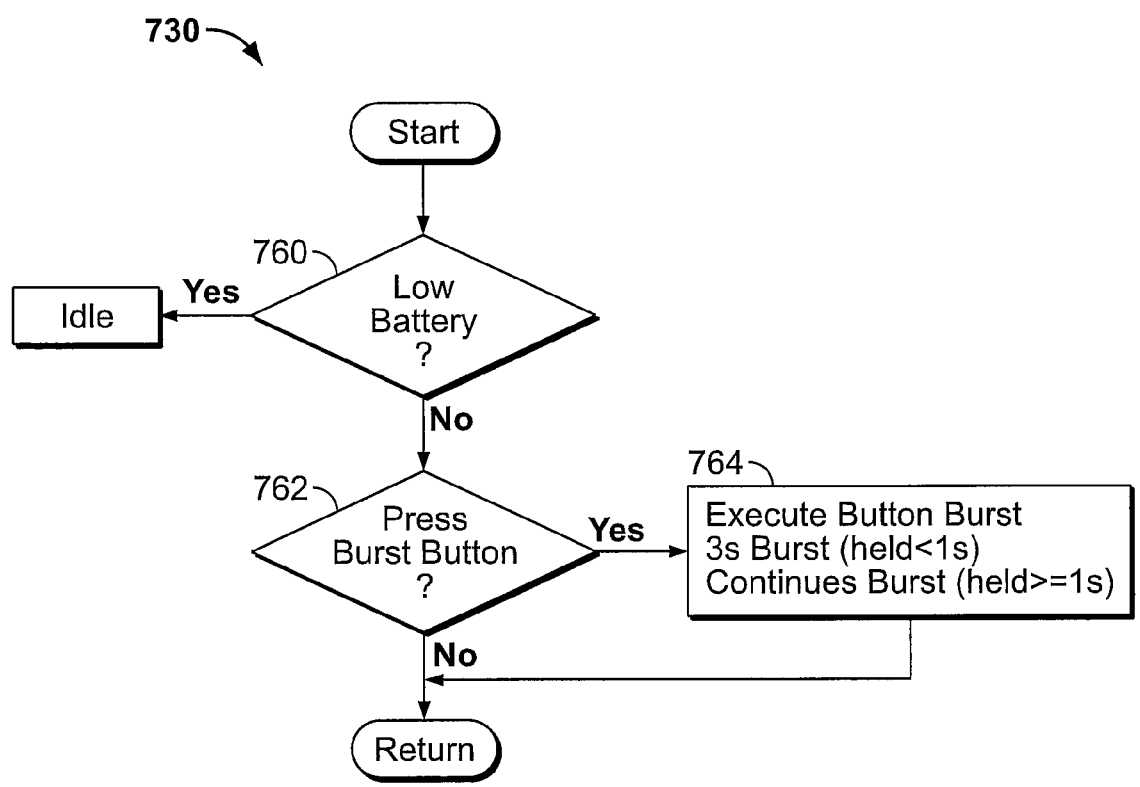

FIGS. 10A and 10B illustrate the operation of the microprocessor 146 in the embodiment of FIG. 7A. Deferring first to FIG. 10A, a main program routine begins upon power-up of the circuit (block 720), and a block 722 checks to determine whether the button 350 has been depressed. If this is not found to be the case a block 724 enables a one-minute startup burst timer, disables detection of the light sensor, and enables a fifteen-minute sensor lockout timer. A block 726 then executes the continuous action air freshening (CAAF) mode of operation wherein the actuator 126 is actuated for 12 mS bursts separated by dwell intervals as determined by the position of the switch 148. A block 728 thereafter executes a routine 730 shown in FIG. 10B to detect the voltage developed by the battery and the position of the switch 154. A block 732 then checks to determine whether the one-minute startup burst timer has expired. If this is not the case, control returns to the block 726. Otherwise, control passes to a block 734, which develops the gating signal of three second duration at the pin 5 so that a three second burst of volatile is emitted.

Following the block 734, a block 736 again invokes the routine 730 to check the voltage developed by the battery and the position of the switch 154. A block 738 then checks to determine whether the fifteen-minute sensor lockout timer has expired, if this is not yet the case, control returns to the block 736. On the other hand, if the block 736 determines that the sensor lockout timer has expired, a block 740 enables detection of the light sensor and a block 742 determines whether motion is detected in the vicinity of the device. If no motion is detected, a block 744 disables the fifteen-minute sensor lockout timer and the microprocessor operates in a "ghost" mode of operation wherein a 12 mS emission sequence is undertaken every two minutes. A block 746 again invokes the routine 730 to check the battery voltage and the position of the switch 154, and control thereafter returns to the block 742.

If the block 742 detects motion in the vicinity of the device, a block 750 disables detection of the light sensor, enables and reinitializes the fifteen-minute sensor lockout timer, initiates operation in the CAAF mode, and develops all immediate three-second bust of volatile, Control then returns to the block 136.

If the block 722 determines that the button 154 has been depressed, a block 752 enables detection of the light sensor and a block 754 checks to determine whether motion is being detected. If so, control passes to the block 750. Otherwise, control passes to the block 724.

As seen in FIG. 10B, the routine 730 begins at a block 760 that determines whether the battery voltage has dropped below a certain level. If this is found to be the case, the microprocessor 146 is placed in an idle state. If this is not the case, a block 762 checks to determine whether the button 154 has been depressed. If this has not occurred, control returns to the appropriate point in the main program, Otherwise, a block 764 develops a gating signal of a duration dependent upon the length of time the button 154 has been depressed. If the button 154 has been depressed less than one second, a three-second gating signal is developed. If the button 154 has been depressed longer than one second, then a gating signal of duration equal to the length of time the button 154 has been depressed is developed. Control then returns to the appropriate point in the main program.

Figure 8A:
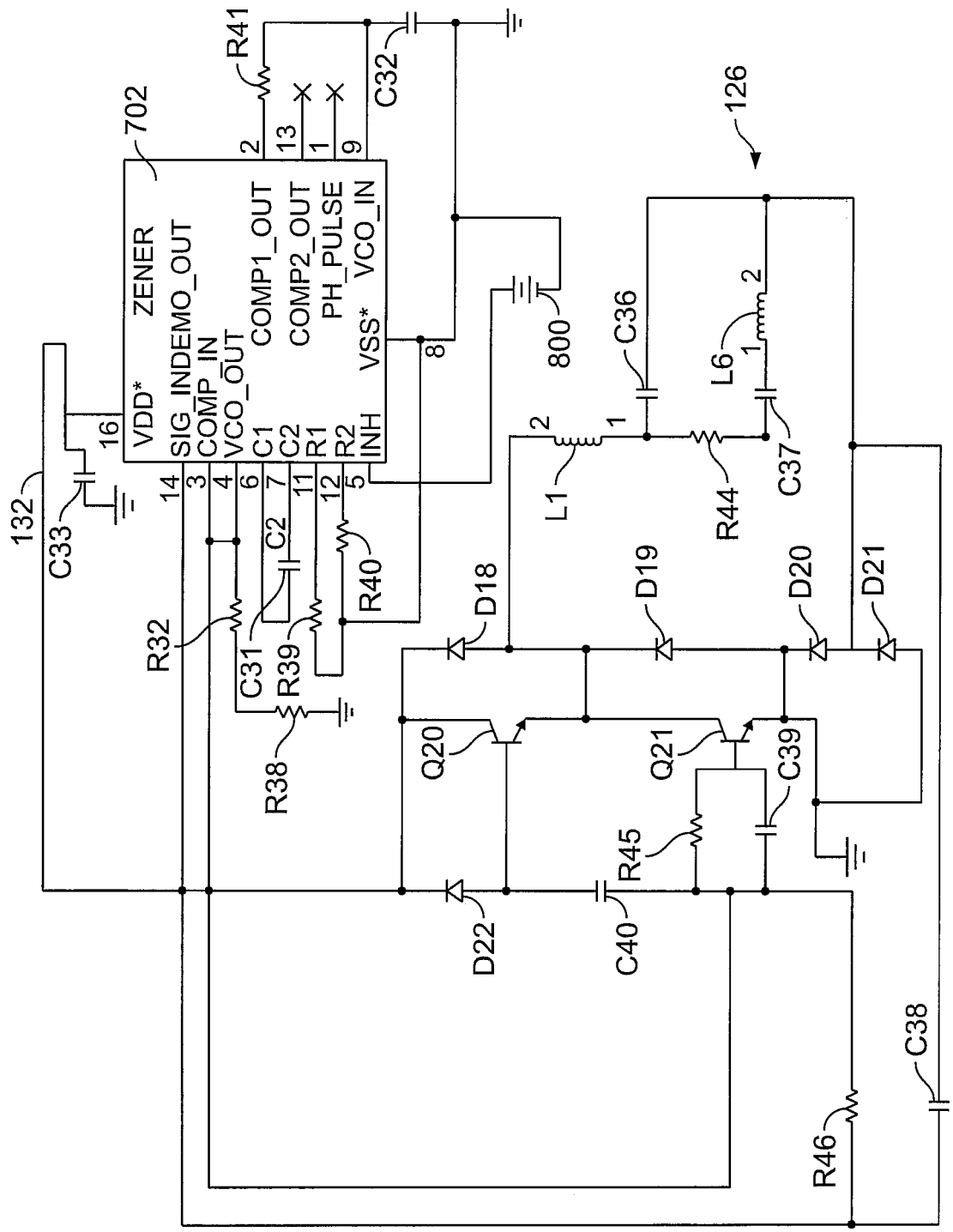
FIG. 8A is a schematic diagram of an implementation of a portion of the embodiment of FIG. 8 using discrete components.

FIG. 8A illustrates an embodiment similar to that of FIG. 8 with the exception that the internal drive logic 514, the transistors Q9, Q10 the feedback resistor R25, and the PLL block 510 are replaced by discrete components. As in the embodiment of 1FIG. 7A, a CD4046 IC 702 is utilized with the resistors R32 and R38-R41 and the capacitors C31-C33. In addition a pin 5 of the IC 702 is coupled to a voltage source 800.

A pair of bipolar transistors Q20, Q21 and associated flyback diodes D18, D19 coupled in anti-parallel relationship therewith are coupled to the inductor L1 and the actuator 126, here represented by impedances including capacitors C36, C37, resistor R44 and inductor L6. A series combination of first and second current sensing diodes D20 and D21 are coupled at a first end thereof to the actuator 126 and are further coupled at a second end thereof to an emitter electrode of the transistor Q21 and to ground. A feedback signal is coupled by a capacitor C38 to a pin 14 of the IC 702.

Pins 3 and 4 of the IC 702 are coupled through a resistor R45 and a capacitor C39 to a base electrode of the transistor Q21. The pins 3 and 4 are further coupled by a capacitor C40 to a base electrode of the transistor Q20. A diode D22 is coupled between the base of the transistor Q20 and the line 132. In addition, a resistor R46 is coupled between the capacitor C38 and the pins 3 and 4 of the IC 702. The components of FIG. 8A are responsive to a gating signal to operate the transistors Q20 and Q21 at a selected resonant frequency of the actuator 126, as in the previous embodiments.

Figure 11:
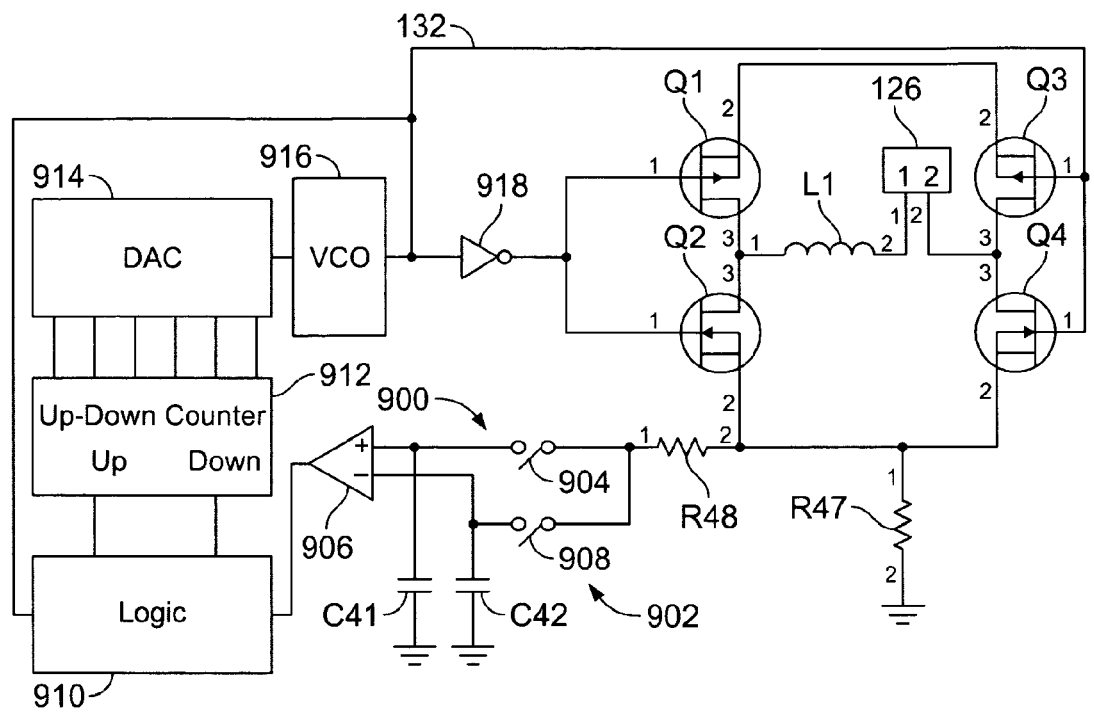
FIG. 11 is a schematic diagram of a ninth embodiment of the drive circuit of FIG. 1.

FIG. 11 illustrates a still further embodiment that dithers the applied frequency and causes the actuator 126 to operate at a selected resonant frequency. This diagram illustrates an analog oscillator with an analog input from a digital/analog converter (DAC) responsive to a counter to control frequency. This circuit could alternatively employ a digitally synthesized frequency from a master clock controlled directly from the counter without the DAC. Also, while the circuit of FIG. 11 utilizes a full-bridge topology, the circuit could instead use any other driver circuit such as the half-bridge topology or a single transistor.

Specifically, the transistors Q1-Q4, the inductor L1 and the actuator 126 are coupled to a current sensing resistor R47. First and second combined low-pass and sample-and-hold (S/H) circuits 900, 902 are coupled to the current sensing resistor R47. The first circuit 900 comprises a resistor R48, a switch 904, a capacitor C41, and an op amp 906. The second circuit 902 comprises the resistor R48, a switch 908, a capacitor C42, and the op amp 906. The switch 904 and the switch 908 are coupled to non-inverting and inverting inputs, respectively, of the op amp 906. A logic circuit 910 converts an output signal developed by the op amp 906 into counter control signals for a counter 912. A DAC 914 converts the counter output into an analog counter signal and a VCO 916 is responsive to the DAC 914 to develop an oscillator signal the drives the transistors Q3 and Q4. An inverter 918 inverts the output of the VCO 916 and controls the transistors Q1 and Q2.

The switches 904, 908 are operated in anti-phase relationship each at 50% duty cycle for 500 microseconds conduction time and the op amp 906 compares the sampled and held voltages to develop a comparison signal. The comparison signal is sensed by the logic circuit 910 to determine whether the counter 912 should count up or down. The current through the actuator 126 is maintained at a selected resonant frequency using this dithering approach.

If desired, other means of developing the feedback signal could be used, such as a current sensing transformer coupled in series with the tank circuit.

Figure 13:
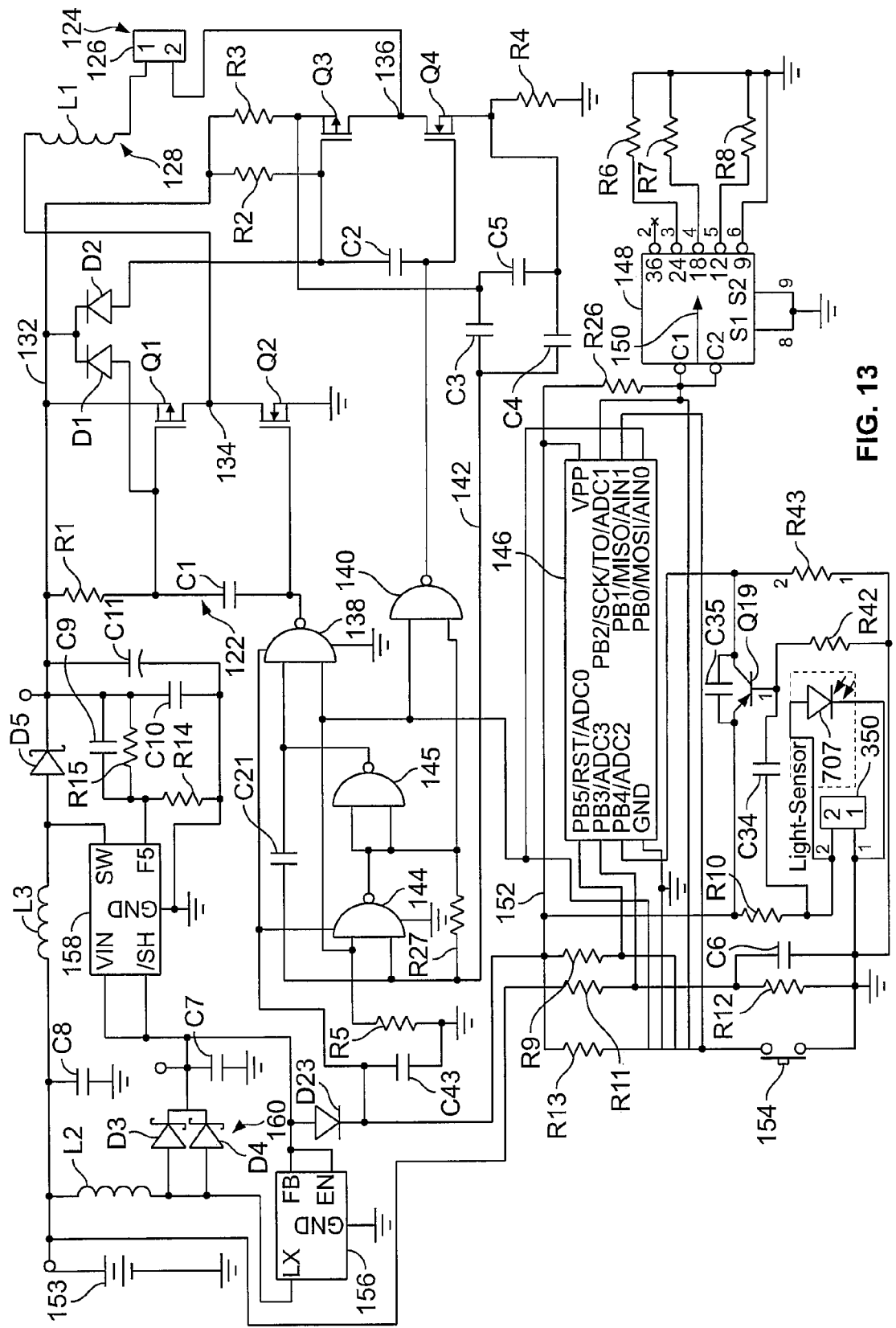
FIG. 13 is a schematic diagram of a tenth embodiment of the present invention.

FIG. 13 illustrates another embodiment that incorporates aspects of the embodiments of FIGS. 2 and 7A. In particular, FIG. 13 comprises the circuit of FIG. 2 together with a diode D23 coupled to resistor R9 and integrated circuits 156, 158 and a capacitor C43 coupled to NAND gates 138 and 144, in combination with the photocell 707 of FIG. 7A and circuitry associated therewith, including resistors R42, R43, capacitors C34, C35 and transistor Q19. The microprocessor 146 of this embodiment can be programmed to implement the routines of FIGS. 10A and 10B.

INDUSTRIAL APPLICABILITY

The embodiments disclosed herein are operable to provide drive current to a piezoelectric actuator at a resonant frequency thereof. Operation at a resonant frequency reduces energy demands on the power source that supplies power for such energization, thereby increasing power source life and/or possibly reducing the number of required power sources for a given product life.

Numerous modifications to the present invention will be apparent to those skilled in the art in view of the foregoing description. Accordingly, this description is to be construed as illustrative only and is presented for the purpose of enabling those skilled in the art to make and use the invention and to teach the best mode of carrying out same. The exclusive rights to all modifications which come within the scope of the appended claims are reserved.

We claim:

1. A drive circuit for a piezoelectric actuator, comprising:
an impedance coupled to the piezoelectric actuator, wherein the impedance and the piezoelectric actuator together form a tank circuit that has a resonant frequency;
a first circuit that drives the actuator at the resonant frequency, the first circuit including a current detector coupled to the tank circuit and that develops a current signal representing current flow in the circuit and a feedback capacitor coupled to the current detector for phase shifting the current signal; and
a second circuit responsive to the phase shifted current signal and a gating signal that selectively operates the first circuit in one of at least two modes of operation including a first mode that causes the actuator to be energized at a first duty cycle and a second mode that causes the actuator to be energized at a second duty cycle greater than the first duty cycle, wherein the second circuit includes at least one NAND gate and the at least one NAND gate receives the gating signal as a first input and the phase shifted current signal as a second input and develops an output signal to operate the first circuit.

2. The drive circuit of claim 1, wherein the first mode comprises automatically periodically energizing the actuator upon start-up of the drive circuit.

3. The drive circuit of claim 2, wherein the second mode temporarily overrides the first mode when the second mode is selected.

4. The drive circuit of claim 1, wherein the second mode comprises a boost mode of operation.

5. The drive circuit of claim 1, wherein operation in the first mode causes the actuator to dispense a volatile at a first rate and operation in the second mode causes the actuator to dispense the volatile at a second rate greater than the first rate.

6. The drive circuit of claim 1, wherein the second circuit operates the first circuit in a third mode of operation in response to detection of motion.

7. The drive circuit of claim 1, wherein the first circuit is responsive to a switch setting to establish a dwell interval between successive energizations of the actuator.

8. The drive circuit of claim 1, wherein the first circuit has a full-bridge topology.

9. The drive circuit of claim 1, wherein the first circuit has a half-bridge topology.

10. The drive circuit of claim 1, wherein the current detector includes a current sensing resistor for detecting current flowing through the actuator.

11. The drive circuit of claim 1, wherein the current detector includes current sensing diodes for detecting current flowing through the actuator.

12. The drive circuit of claim 1, wherein the first circuit includes at least one transistor coupled to the actuator and further including a circuit that detects an on resistance of the at least one transistor to detect current flowing through the actuator.

13. The drive circuit of claim 5, wherein the second rate is about fourteen percent duty cycle and has a duration of about seven seconds.

14. The drive circuit of claim 5, wherein the second rate is about fifty percent duty cycle and has a duration determined by the length of time that a boost switch is activated.

15. The drive circuit of claim 1, wherein the first circuit further comprises a phase-locked-loop.

16. The drive circuit of claim 1, wherein the second circuit further comprises an oscillator that develops an oscillator signal that is dithered.

17. The drive circuit of claim 1, further including at least one LED driven by an energization waveform.

18. A drive circuit for a piezoelectric actuator that dispenses a volatile, comprising:
    an impedance coupled to the piezoelectric actuator, wherein the impedance and the piezoelectric actuator together form a tank circuit that has a resonant frequency;
    a first circuit that drives the actuator at the resonant frequency, the first circuit including a current detector coupled to the tank circuit and that develops a current signal representing current flow in the tank circuit and a feedback capacitor coupled to the current detector for phase shifting the current signal; and
    a second circuit responsive to the phase shifted current signal and a gating signal that selectively operates the first circuit in one of at least two modes of operation including a first mode that causes the actuator to dispense volatile at a first rate and a second mode that causes the actuator to dispense volatile at a second rate greater than the first rate, wherein the first mode comprises automatically periodically energizing the actuator upon start-up of the drive circuit, and wherein the second mode temporarily overrides the first mode when the second mode is selected, further wherein the second circuit includes at least one NAND gate and the at least one NAND gate receives the gating signal as a first input and the phase shifted current signal as a second input and develops an output signal to operate the first circuit.

19. The drive circuit of claim 18, wherein the second circuit operates the first circuit in a third mode of operation in response to detection of motion.

20. The drive circuit of claim 18, wherein the first circuit is responsive to a switch setting to establish a dwell interval between successive energizations of the actuator.

21. The drive circuit of claim 18, wherein the first circuit has a full-bridge topology.

22. The drive circuit of claim 18, wherein the first circuit has a half-bridge topology.

23. The drive circuit of claim 18, wherein the current detector includes a current sensing resistor for detecting current flowing through the actuator.

24. The drive circuit of claim 18 wherein the current detector includes current sensing diodes for detecting current flowing through the actuator.

25. The drive circuit of claim 18, wherein the first circuit includes at least one transistor coupled to the actuator and circuits for detecting an on resistance of the at least one transistor to detect current flowing through the actuator.

26. The drive circuit of claim 18, wherein the second circuit further comprises a phase-locked-loop.

27. The drive circuit of claim 18, wherein the second circuit further comprises an oscillator that develops an oscillator signal that is dithered.

28. The drive circuit of claim 18, further including at least one LED driven by an energization waveform.

29. A method of driving a piezoelectric actuator, the method comprising the steps of:
    coupling an impedance to the piezoelectric actuator, wherein the impedance and the piezoelectric actuator together form a tank circuit that has a resonant frequency;
    providing a first circuit that drives the actuator at the resonant frequency, the first circuit including a current detector coupled to the tank circuit and that develops a current signal representing current flow in the tank circuit and a feedback capacitor coupled to the current detector for phase shifting the current signal; and
    providing a second circuit responsive to the phase shifted current signal and a gating signal that selectively operates the first circuit in one of at least two modes of operation including a first mode that causes the actuator to be energized at a first duty cycle and a second mode that causes the actuator to be energized at a second duty cycle greater than the first duty cycle, wherein the second circuit includes at least one NAND gate and the at least one NAND ate receives the gating signal as a first input and the phase shifted current signal as a second input and develops an output signal to operate the first circuit.

30. The method of claim 29, wherein the first mode comprises automatically periodically energizing the actuator upon start-up of the drive circuit.

31. The method of claim 29, wherein the second mode temporarily overrides the first mode when the second mode is selected.

32. The method of claim 29, wherein the second mode comprises a boost mode of operation.

33. The method of claim 29, wherein operation in the first mode causes the actuator to dispense a volatile at a first rate and operation in the second mode causes the actuator to dispense the volatile at a second rate greater than the first rate.

34. The method of claim 33, wherein the second rate is about fourteen percent duty cycle and has a duration of about seven seconds.

35. The method of claim 33, wherein the second rate is about fifty percent duty cycle and has a duration determined by the length of time that a boost switch is activated.

36. The method of claim 29, wherein the second circuit operates the first circuit in a third mode of operation in response to detection of motion.

37. The method of claim 29, wherein the first circuit is responsive to a switch setting to establish a dwell interval between successive energizations of the actuator.

38. The method of claim 29, wherein the first circuit has a full-bridge topology.

39. The method of claim 29, wherein the first circuit has a half-bridge topology.

40. The method of claim 29, wherein the current detector includes a current sensing resistor for detecting current flowing through the actuator.

41. The method of claim 29, wherein the current detector includes current sensing diodes for detecting current flowing through the actuator.

42. The method of claim 29, wherein the first circuit includes at least one transistor coupled to the actuator and further including a circuit that detects an on resistance of the at least one transistor to detect current flowing through the actuator.

43. The method of claim 29, wherein the second circuit further comprises a phase-locked-loop.

44. The method of claim 29, wherein the second circuit further comprises an oscillator that develops an oscillator signal that is dithered.

45. The method of claim 29, further including at least one LED driven by an energization waveform.

* * * * *

UNITED STATES PATENT AND TRADEMARK OFFICE
CERTIFICATE OF CORRECTION

PATENT NO.         : 7,538,473 B2  
APPLICATION NO. : 11/464419  
DATED              : May 26, 2009  
INVENTOR(S)     : Thomas P. Blandino, Tai P. Luc and Peter Zhou Page 1 of 1

It is certified that error appears in the above-identified patent and that said Letters Patent is hereby corrected as shown below:

Column 18, line 35: replace "ate" with --gate--

Signed and Sealed this

Thirtieth Day of June, 2009

JOHN DOLL  
*Acting Director of the United States Patent and Trademark Office*